(12) United States Patent
Wolfe et al.

(10) Patent No.: US 9,638,755 B2
(45) Date of Patent: May 2, 2017

(54) TEST SWITCH SIGNAL ANALYZER

(71) Applicant: Fischer Block, Inc., Royersford, PA (US)

(72) Inventors: Margaret Wolfe, Royersford, PA (US); Gregory Wolfe, Royersford, PA (US)

(73) Assignee: Fischer Block, Inc., Royersford, PA (US)

( * ) Notice: Subject to any disclaimer, the term of this patent is extended or adjusted under 35 U.S.C. 154(b) by 0 days.

(21) Appl. No.: 14/781,850

(22) PCT Filed: Mar. 19, 2015

(86) PCT No.: PCT/US2015/021593
§ 371 (c)(1),
(2) Date: Oct. 1, 2015

(87) PCT Pub. No.: WO2015/143233
PCT Pub. Date: Sep. 24, 2015

(65) Prior Publication Data
US 2016/0033578 A1    Feb. 4, 2016

Related U.S. Application Data

(60) Provisional application No. 61/955,398, filed on Mar. 19, 2014, provisional application No. 61/955,430, (Continued)

(51) Int. Cl.
*G01R 31/327* (2006.01)
*G01R 1/20* (2006.01)
(Continued)

(52) U.S. Cl.
CPC .......... *G01R 31/3278* (2013.01); *G01R 1/206* (2013.01); *G01R 15/142* (2013.01); *G01R 19/00* (2013.01)

(58) Field of Classification Search
None
See application file for complete search history.

(56) References Cited

U.S. PATENT DOCUMENTS 6,836,108 B1   12/2004   Balko et al.
7,414,411 B2 *  8/2008   Tan .................... G01R 1/06772
                                                324/601

(Continued)

OTHER PUBLICATIONS

International Patent Application No. PCT/US2015/021593, Notification of Transmittal of the International Search Report and the Written Opinion of the International Searching Authority, or the Declaration, dated Aug. 11, 2015, 17 pages.

*Primary Examiner* — Jermele M Hollington
(74) *Attorney, Agent, or Firm* — Morgan, Lewis & Bockius LLP

(57) ABSTRACT

A test switch signal analyzer comprising: an analyzer hub operably couplable to a test switch base that includes test switch conductors; signal probe(s) couplable to the analyzer hub and to the plurality of test switch conductors when the analyzer hub is coupled to the test switch base, a signal processing unit coupled to the analyzer hub; the signal processing unit, the analyzer hub, and at least a portion of the at least one signal probe being positionable within a test switch cover that mates with the test switch base when the signal probe is coupled to the test switch conductor(s) and the test switch cover is secured to the test switch base.

65 Claims, 31 Drawing Sheets

Related U.S. Application Data filed on Mar. 19, 2014, provisional application No. 61/981,875, filed on Apr. 21, 2014, provisional application No. 61/993,480, filed on May 15, 2014, provisional application No. 62/064,755, filed on Oct. 16, 2014.

(51) Int. Cl.
    *G01R 15/14*     (2006.01)
    *G01R 19/00*     (2006.01)

(56) References Cited

U.S. PATENT DOCUMENTS

| | | |
|---|---|---|
| 8,723,530 B2 * | 5/2014 | Bartlett ................ G01R 35/005 324/601 |
| 2004/0027748 A1 | 2/2004 | Kojovic et al. |
| 2006/0139858 A1 | 6/2006 | Lewis et al. |
| 2008/0011589 A1 | 1/2008 | Ball et al. |
| 2010/0185417 A1 | 7/2010 | Bou et al. |
| 2011/0028031 A1 | 2/2011 | Bower et al. |
| 2011/0074390 A1 * | 3/2011 | Bartlett .............. G01R 1/06766 324/76.41 |
| 2011/0170534 A1 | 7/2011 | York |
| 2013/0120090 A1 | 5/2013 | Ball |

* cited by examiner

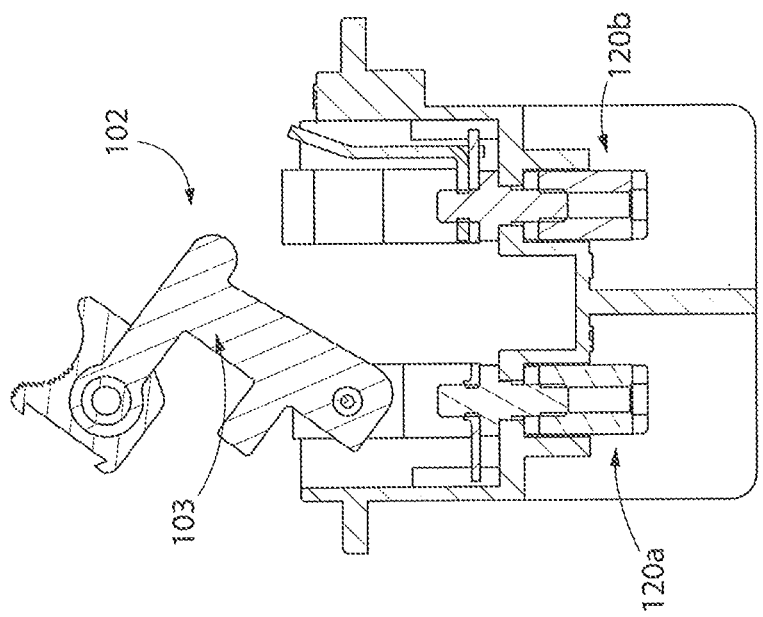
FIG. 1C CLOSED Position
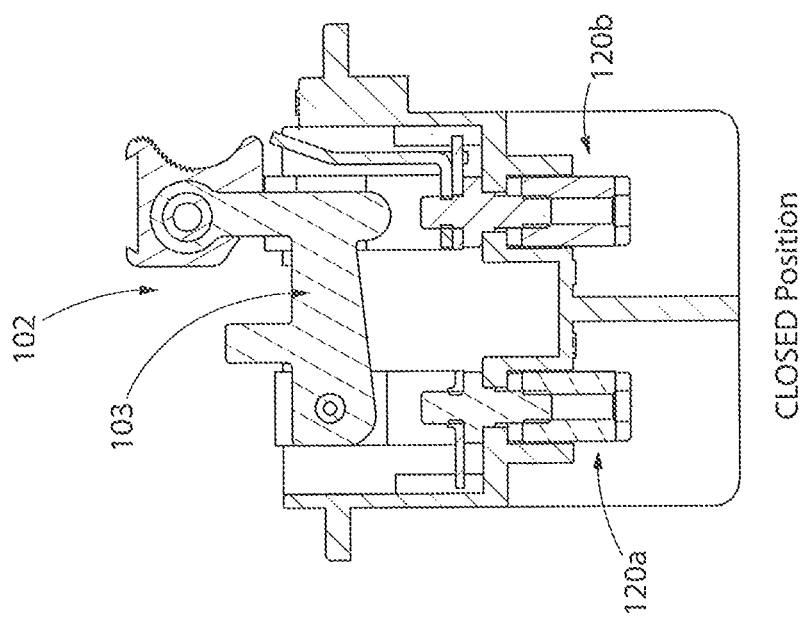
FIG. 1D OPEN Position

TEST SWITCH SIGNAL ANALYZER

CROSS-REFERENCE TO RELATED APPLICATIONS

This application is a National Stage Entry of International Patent Application No. PCT/US2015/021593, filed on Mar. 19, 2015, entitled "TEST SWITCH SIGNAL ANALYZER" which claims the benefit of U.S. Provisional Patent Application No. 61/955,398 filed Mar. 19, 2014 entitled "Environmentally sealed test switch cover", U.S. Provisional Patent Application No. 61/955,430 filed Mar. 19, 2014 entitled "INTELLIGENT INTERCONNECT MODULE", U.S. Provisional Patent Application No. 61/981,875 filed Apr. 21, 2014 entitled "INTELLIGENT INTERCONNECT MODULE", U.S. Provisional Patent Application No. 61/993,480 filed May 15, 2014 entitled "INTELLIGENT INTERCONNECT MODULE", U.S. Provisional Patent Application No. 62/064,755 filed Oct. 16, 2014 entitled "TEST SWITCH SIGNAL ANALYZER", incorporated by reference herein in their entirety.

FIELD OF THE INVENTION

The present invention generally relates to monitoring of electrical components such as test switches, a test switch signal analyzer, a method of selectively transmitting an electrical signal from a test switch, a method of installing a test switch signal analyzer and a method of assembling a test switch signal analyzer and a method for synchronizing wireless devices.

BACKGROUND

Current electrical networks (e.g., a power grid) are generally comprised of a system of wires and substations that generate electricity at a substation (e.g., coal, solar, etc.) and deliver the electricity to customers. The current electrical networks include a number of motors and generators connected between the substation and the customer to assist with delivery of the electricity to the customers.

Relay systems, comprised of relays and circuit breakers, can be used in current electrical networks to detect various electrical problems (e.g., current surge, dynamic disturbances) and protect the motors and generators by cutting off electricity when a problem is detected. Relays and circuit breakers function together to trip the circuit breakers in the event of a detected problem in a current electrical network, thereby resulting in a power outage. However, sometimes power outages can occur due to faulty equipment (e.g., relay failure), making it unclear if the power outage occurred due to faulty equipment or a legitimate detected problem. Therefore, after a power outage condition occurs, engineers will test each piece of equipment to try to determine whether the piece of equipment is functioning properly.

Testing individual pieces of equipment (e.g., relays) in a network can be difficult, due to the fact that there are many pieces of equipment to test and that all of the equipment is connected via wires. To improve testing efficiency, each piece of equipment can be fitted with a test switch unit. The test switch unit, when enabled, isolates the piece of equipment from the rest of the system, allowing engineers to determine if the piece of equipment is functional.

While it is helpful to understand whether the piece of equipment is functioning correctly after a power outage, it is also helpful to know why the piece of equipment performed in a particular manner in response to an electrical problem. The National Energy Regulatory Commission (NERC) created new guidelines requiring energy providers to constantly monitor and record network activity to explain why equipment functioned in a particular manner.

SUMMARY

In one embodiment, there is a test switch signal analyzer including an analyzer hub operably couplable to a test switch base; a signal probe operatively couplable to the analyzer hub and to a test switch conductor when the analyzer hub is coupled to the test switch base; a signal processing unit coupled to the analyzer hub and configured to receive probe signals from the signal probe, where the signal processing unit, the analyzer hub, and a portion of the signal probe is positionable within a test switch cover. In a further embodiment, the test switch cover is configured and dimensioned to mate with the test switch base when the signal probe is coupled to one of the test switch conductors and the test switch cover is secured to the test switch base. In a further embodiment, each of the signal probes are configured to receive electrical signals from a test switch conductor and to generate a probe signal that corresponds to the received electrical signal. In a further embodiment, the signal processing unit is configured to determine a plurality of measured electrical signal values based on the probe signals received from the at least one signal prob.

In a further embodiment, the test switch cover and the test switch base enclose the test switch signal analyzer when the test switch cover is removably secured to the test switch base.

In a further embodiment, at least one of: the signal processing unit, the analyzer hub and the signal probe is integral to the test switch cover. In a further embodiment, the signal processing unit is integral to the analyzer hub.

In a further embodiment, the test switch cover includes a perimeter engagement surface configured and dimensioned such that substantially all of the permitted engagement surface contacts the test switch base when the test switch cover is secured to the test switch base.

In a further embodiment, the test switch cover is configured and dimensioned to mate with and mount to the front of the test switch base and to the rear of the test switch base.

In a further embodiment, the analyzer hub is at least one of: a panel, a circuit board, a portion of a circuit board, a connector, and a mesh of wires.

In a further embodiment, the signal probe is a voltage probe or a current probe.

In a further embodiment, the current probe is a Rogowski coil, a slotted probe or a CT probe.

In a further embodiment, the slotted probe is configured to slideably straddle a test switch conductor when the test switch conductor is in a closed position. In a further embodiment, the slotted probe has a slotted first electrically conducting face and a slotted second electrically conducting face that spaced apart to align with and couple to current-carrying springs on two sides of a non-shorting knife blade of the test switch conductor when the non-shorting blade is in the closed position. In a further embodiment, the first electrically conducting face is electrically couplable to a first current spring contact of the test switch base and the second electrically conducting face is electrically couplable to a second current spring contact of the test switch base when the non-shorting blade is in a closed position. In a further embodiment, the slotted probe includes an insulator disposed between the first electrically conducting face and the second electrically conducting face. In a further embodiment, the slotted probe includes a first lead and a second lead, the first lead electrically coupled to the first electrically conducting face and to the analyzer hub, the second lead electrically coupled to the second electrically conducting face and to the analyzer hub.

In a further embodiment, the Rogowski coil includes a distal end that is configured and dimensioned to wrap around a test switch conductor when the test switch conductor is carrying a current, the test switch cover is secured to the test switch base and a proximal end of the Rogowski coil is operably coupled to the analyzer hub.

In a further embodiment, the at least one signal probe includes at least one voltage probe having an input portion couplable to the analyzer hub and a contact portion that is configured to contact a non-insulated portion of the test switch conductor when the test switch conductor is carrying a voltage, the test switch cover is secured to the test switch base and the input portion is operably coupled to the analyzer hub. In a further embodiment, the contact portion includes a spring-loaded contact. In a further embodiment, the at least one signal probe includes a plurality of voltage probes, each voltage probe comprising a spring-loaded contact positionable on the analyzer hub such that when the analyzer hub and the test switch cover are coupled to the test switch base, each voltage probe contacts a non-insulated portion of a test switch conductor.

In a further embodiment, the signal processing unit is configured to determine at least one derived signal value from a set of sampled signal values associated with the one or more probe signals, the at least one derived signal value being representative of at least one of: voltage, RMS voltage, frequency of voltage, voltage waveforms, current, RMS current, frequency of current, current waveforms, time, harmonics, offset, phasor, phasor measurement unit, phasor amplitude, phasor phase, phasor waveforms, position in a cycle, rate of change of any probe signal and combinations thereof. In a further embodiment, the signal processing unit is configured to store, in a storage medium, at least one of: the set of sampled signal values and the at least one derived signal value. In a further embodiment, the signal processing unit includes a computer readable medium having data, instructions or a combination thereof for generating and storing at least one electrical signal record based upon the set of sampled signal values or derived signal values associated with the one or more test switch conductors.

In a further embodiment, the signal processing unit is configured to determine at least one derived signal value from a set of sampled signal values associated with the one or more probe signals, the at least one derived signal value being representative of at least one of: voltage, RMS voltage, frequency of voltage, voltage waveforms, current, RMS current, frequency of current, current waveforms, power, average power, real power, reactive power, power waveforms, resistance, impedance, conductance, time, harmonics, offset, phase, phasor, phasor measurement unit, phasor amplitude, phasor phase, phasor waveforms, position in a cycle, and rate of change of any electrical signal.

In a further embodiment, the signal processing unit is configured to store, in a storage medium, at least one of: the sampled signal values associated with the two or more probe signals and the at least one derived signal value.

In a further embodiment, the computer readable medium is configured to perform a mathematic computation having data, instructions or a combination thereof generating and storing at least one electrical signal record based upon two or more sampled signal values or the derived signal values.

In a further embodiment, the signal processing unit includes a transmitter configured to transmit the at least one electrical signal record, the at least one derived signal value or the at least one measured electrical signal value to a device external to the test switch cover.

In a further embodiment, the signal processing unit is configured to transmit the at least one electrical signal record, the at least one derived signal value or the at least one sampled signal value to the device external to the test switch cover when the sampled signal value exceeds a predetermined threshold value.

In a further embodiment, the signal processing unit is configured to transmit the at least one electrical signal record, the at least one derived signal value or the at least one sampled signal value to the device external to the test switch cover when the derived signal value exceeds a predetermined threshold value.

In a further embodiment, the signal processing unit is configured to: determine a first derived signal value from a set of sampled signal values sampled at a first time-based sampling interval and a second set of sampled signal values sampled at a second time-based sampling interval, compare the first derived signal value a threshold value, and transmit the second derived signal value and the second set of sampled signal values to the external device if the first derived signal value exceeds the threshold value.

In a further embodiment, the first time-based sampling interval and second time-based sampling interval are user-selected.

In a further embodiment, the signal processing unit includes a receiver configured to: receive a request from an external device for at least one sampled signal value, and transmit the at least one sampled signal value in response to the request from an external device.

In a further embodiment, the signal processing unit includes a receiver configured to: receive a request from an external device for at least one derived signal value, and transmit the at least one derived signal value in response to the request from an external device.

In a further embodiment, the slotted probe is configured to slideably straddle the non-shorting blade when the non-shorting blade is in the closed position such that the slotted probe is in electrical contact with current-carrying springs on both sides of the non-shorting blade.

In a further embodiment, the slotted probe is positionable in an installed position in electrical contact with the current-carrying springs on first and second sides of a non-shorting blade of the test switch conductor, in the installed position, the slotted probe being in contact with an insulator disposed over a portion of the non-shorting blade, the insulator configured to prevent electrical contact between the non-shorting blade and a terminal of the test switch base when the non-shorting blade is in the closed position.

In a further embodiment, the at least one signal probe includes an RJ connector configured to releasably engage with the analyzer hub.

In a further embodiment, the analyzer hub includes a printed circuit board that includes a plurality of signal probe coupling components, each signal probe coupling component being couplable to at least one of the plurality of signal probes.

In a further embodiment, the at least one signal probe is engageable with the analyzer hub in a plurality of selectable positions.

In a further embodiment, the selectable positions align with a conductor feature of the test switch.

In a further embodiment, the at least one signal probe includes a plurality of spring loaded contacts positioned on the analyzer hub in a first row that aligns with a first row of terminal contacts on the test switch when the analyzer hub is coupled to the test switch base.

In a further embodiment, the analyzer hub includes a second row of terminal contacts and the at least one signal probe includes at least one slotted probe positioned on the analyzer hub in a second row that aligns with a second row of terminal contact when the analyzer hub is coupled to the test switch base.

In a further embodiment, the at least one signal probe includes at least one Rogowski coil positioned on the analyzer hub to align with a terminal contact in a second row when the analyzer hub is coupled to the test switch base.

In a further embodiment, the test switch analyzer includes a printed circuit board that includes a plurality of contact apertures that are aligned with terminals of the test switch base, the contact apertures configured to receive a probe.

In a further embodiment, the test switch analyzer includes a printed circuit board that includes two rows of contact apertures, each contact aperture configured to receive a probe such that each probe is aligned with a feature of one of the plurality of test switch conductors after said probe is received in the contact aperture.

In a further embodiment, the test switch analyzer includes a user-interface coupled to the signal processing unit, whereby such user-interface contains at least one of an optical display, a touch-screen display, a mouse, a touchpad, a joystick, a keypad, and push buttons.

In a further embodiment, the test switch analyzer includes at least one access port such that when test switch cover is secured to the test switch base, the user-interface coupled to the signal processing unit is visible and touchable from outside the test switch cover. In a further embodiment, the test switch analyzer includes a translucent lens embedded in the outer surface of the test switch cover whereby, when such test switch cover is secured to the test switch base, the user-interface coupled to the signal processing unit is visible from outside the test switch cover.

In a further embodiment, the test switch base is integral to a second device and wherein the test switch cover includes a perimeter engagement surface configured and dimensioned such that substantially all of the permitted engagement surface contacts the another device when the test switch cover is secured to the test switch base. In a further embodiment, the second device is a substation relay. In a further embodiment, the second device is an electric meter.

In a further embodiment, the test switch cover includes conductors which are aligned with the conductors in the test switch base and such conductors in the test switch cover complete the conductor circuit paths in the test switch base when the removably securable test switch cover is secured to the test switch base and act to open the conductor circuit paths in the test switch base when the test switch cover is removed from the test switch base.

In one embodiment, there is a method of selectively transmitting an electrical signal, the method including generating a first set of sampled signal values associated with a probe signal at a first time-interval and a second set of sampled signal values associated with the probe signal at a second time-interval, the first time-interval overlapping with and second time-interval overlap, the first time-interval differing from the second time-interval; generating a derived signal value from the first set of sampled signal values; comparing the derived signal value to a predetermined threshold value; and transmitting the second set of sampled signal values when the derived signal value exceeds the predetermined threshold value.

In one embodiment, the method further including: recording the second set of sampled signal values to a storage medium when the derived signal value exceeds the predetermined threshold value.

In one embodiment, the method further including: transmitting the derived signal value to an external device.

In one embodiment, the external device compares the derived signal value to the predetermined threshold value.

In one embodiment, the method further including: receiving a request for the second set of sampled signal values from the external device when the derived signal value exceeds the predetermined threshold value; and transmitting the second set of sampled signal values to the external device.

In one embodiment, the method further including: generating a third set of sampled signal values associated with a second probe signal at the first time-interval and generating the derived signal value from the first set of sampled signal values and the third set of sampled signal values.

In one embodiment, the method further including: generating an electrical signal record including at least one of: a sequence-of-event record, a fault record, and a dynamic disturbance record, when the derived signal value exceeds the predetermined threshold value; and transmitting the electrical signal record when the derived signal value exceeds the predetermined threshold value.

In one embodiment, there is a method of installing a test switch signal analyzer, the method including: coupling at least one signal probe to an analyzer hub, each signal probe being positioned on the analyzer hub and corresponding to a feature of a test switch conductor; attaching the analyzer hub to the test switch base to complete an electrical connection between the at least one signal probe and the test switch conductor; and attaching the test switch cover to the test switch base.

In a further embodiment, the analyzer hub is integral to the test switch cover and further including: attaching the test switch cover to the test switch base to complete the electrical connection between the at least one signal probe and the test switch conductor.

In a further embodiment, the test switch cover includes a perimeter engagement surface configured and dimensioned such that substantially all of the permitted engagement surface contacts the test switch base when the test switch cover is secured to the test switch base.

In a further embodiment, the method further including: mounting the test switch cover to the front or rear of the test switch base.

In a further embodiment, the method further including: decoupling the at least one signal probe from a first selectable location and coupling the at least one signal probe to a second selectable location.

In a further embodiment, the at least one signal probe includes a voltage probe or a current probe.

In a further embodiment, the current probe is a Rogowski coil, a slotted probe, or a CT probe.

In a further embodiment, the method further including: slideably coupling the slotted current probe with a first portion of the test switch conductor and slideably coupling an insulator with a second portion of the test switch conductor to prevent an electrical coupling between the non-shorting blade and a terminal of the test switch base.

In one embodiment, there is a method of installing a test switch signal analyzer, the method including: coupling a first end of at least one signal probe to an analyzer hub; coupling a second end of the at least one signal probe to the test switch conductor to complete an electrical connection between the analyzer hub and the test switch conductor; attaching the analyzer hub to the test switch base; and attaching the test switch cover to the test switch base when the analyzer hub is attached to the test switch base.

In a further embodiment, the analyzer hub is integral to the test switch cover.

In a further embodiment, the test switch cover includes a perimeter engagement surface configured and dimensioned such that substantially all of the permitted engagement surface contacts the test switch base when the test switch cover is secured to the test switch base.

In a further embodiment, the method further including: mounting the test switch cover to the front or rear of the test switch base.

In a further embodiment, the method further including: decoupling the at least one signal probe from a first selectable location and coupling the at least one signal probe to a second selectable location.

In a further embodiment, wherein the at least one signal probe includes a voltage probe.

In a further embodiment, the at least one signal probe includes a current probe.

In a further embodiment, the current probe includes a Rogowski coil.

In a further embodiment, the current probe includes a slotted probe.

In a further embodiment, the method further including: slideably coupling the slotted current probe to a first portion of the test switch conductor and slideably coupling an insulator to a second portion of the test switch conductor to prevent an electrical coupling between the non-shorting blade and a terminal of the test switch base.

In a further embodiment, there is a method of assembling a test switch signal analyzer having an analyzer hub including (i) a signal processing unit configured to process electrical signal characteristics on a test switch conductor received from at least one signal probe, (ii) first and second groups of apertures, each aperture configured to receive a signal probe, the method including: coupling the at least one signal probe to at least one of the apertures of the printed circuit board, the at least one signal probe being coupled to a test switch conductor when the analyzer hub is attached to the test switch base.

In a further embodiment, the analyzer hub is integral to the test switch cover and the at least one signal probe being coupled to the at least one test switch conductor when the test switch cover is secured to the test switch base.

In a further embodiment, the first group of apertures are aligned in a row such that the at least one signal probe is coupled to the at least one test switch conductor when the at least one signal probe is coupled to at least one of the apertures in the first group of apertures and when the test switch cover is secured to the test switch base.

In a further embodiment, the first group of apertures are configured to receive a voltage signal probe.

In a further embodiment, the method further including: coupling at least one current probe to at least one aperture of the second group of apertures.

In a further embodiment, the method further including: coupling the analyzer hub to the test switch base.

In a further embodiment, each of the at least one signal probe is one of: a voltage probe, a current probe, a Rogowski coil, and a slotted probe.

In a further embodiment, the at least one signal probe is configured to measure electrical signals on the at least one test switch conductor when the at least one test switch conductor is in either of: an open and a closed position and generate the at least one probe signal.

In a further embodiment, the signal processing unit samples each probe signal and generates a plurality of sampled signal values.

In a further embodiment, each sampled signal value has a time-based relation to another sampled signal value.

In a further embodiment, the signal processing unit samples the at least one probe signal received from the at least one signal probe according to a time-based sampling interval.

In a further embodiment, the time-based sampling interval is a uniform sampling interval.

In a further embodiment, the time-based sampling interval is a random sampling interval.

In one embodiment, there is a method for synchronizing wireless devices, the method including: synchronizing an internal clock of a first device and an internal clock of a second device wiredly and wirelessly coupled to the first device, via a wired network; receiving, at the second device and a third device wirelessly coupled to the first device and the second device, a wireless data packet from the first device via a wireless network, the data packet including a timestamp indicating a time when the data packet was transmitted by the first device; calculating, at the second device, a wireless network propagation delay based on a time difference between the time when the wireless data packet was transmitted by the first device and a time of the internal clock of the second device when the second device receives the wireless data packet; transmitting the wireless network propagation delay to the third device; and adjusting an internal clock of the third device based on the time when the wireless data packet was transmitted by the first device and the wireless network propagation delay.

In a further embodiment, the step of adjusting the internal clock of the third device based on the time when the data packet was transmitted by the first device further includes: setting a time of the internal clock of the third device equal to the time when the data packet was transmitted by the first device as indicated by the timestamp.

In a further embodiment, the step of adjusting an internal clock of a third device based on the wireless network propagation delay, further includes: adding the wireless network propagation delay to a time of the internal clock of the third device.

In a further embodiment, the step of synchronizing further includes: synchronizing the internal clock of the first device and the internal clock of the second device with an internal clock of a grandmaster clock via the wired network.

In a further embodiment, the first device is an ethernet switch.

In a further embodiment, the third device is a plurality of wireless devices.

In one embodiment, there is a system for synchronizing wireless devices, the system including: a first device including an internal clock; a second device wiredly and wirelessly couplable to the first device, the second device including an internal clock, the internal clock of the second device being synchronized to the internal clock of the first device via a wired network; a third device wirelessly couplable to the first device and the second device, the second device and third device configured to receive a wireless data packet from the first device via a wireless network, the wireless data packet including a timestamp indicating a time when the wireless data packet was transmitted by the first device, the second device configured to calculate a wireless network propagation delay based on a time difference between the time when the wireless data packet was transmitted by the first device and a time of the internal clock of the second device when the second device receives the wireless data packet, the second device configured to transmit the wireless network propagation delay to the third device, the third device including an internal clock, the third device configured to adjust the internal clock of the third device based on the time when the wireless data packet was transmitted by the first device and the wireless network propagation delay.

In a further embodiment, the third device is configured to adjust the internal clock based on the time when the data packet was transmitted by the first device by setting a time of the internal clock of the third device equal to the time when the data packet was transmitted by the first device as indicated by the timestamp.

In a further embodiment, the third device is configured to adjust the internal clock of the third device based on the wireless network propagation delay by adding the wireless network propagation delay to a time of the internal clock of the third device.

In a further embodiment, the internal clock of the first device and the internal clock of the second device is synchronized with an internal clock of a grandmaster clock via the wired network.

In a further embodiment, the first device is an ethernet switch.

In a further embodiment, the third device is a plurality of wireless devices.

In a further embodiment, the current probe includes a CT probe.

In a further embodiment, the CT probe is configured to wrap around wiring external to the test switch base and couple to the test switch conductor when the test switch conductor is in a closed position.

In a further embodiment, the Rogowski coil is configured to wrap around wiring external to the test switch base and couple to the test switch conductor when the test switch conductor is in a closed position.

In a further embodiment, the at least one signal probe is extendable through an aperture in the test switch cover.

In a further embodiment, the at least one signal probe is extendable through an aperture in the test switch base.

In a further embodiment, the at least one signal probe is extendable through an opening between the test switch cover and the test switch base.

BRIEF DESCRIPTION OF THE SEVERAL VIEWS OF THE DRAWINGS

The foregoing summary, as well as the following detailed description of embodiments of the invention, will be better understood when read in conjunction with the appended drawings of an exemplary embodiment. It should be understood, however, that the invention is not limited to the precise arrangements and instrumentalities shown.

In the drawings:

FIG. 1C depicts a side view of a first exemplary test switch base having a test switch conductor in a CLOSED position according to at least one embodiment of the invention;

FIG. 1D depicts a side view of a first exemplary test switch base having a test switch conductor in an OPEN position according to at least one embodiment of the invention;

DETAILED DESCRIPTION

Figure 1B:
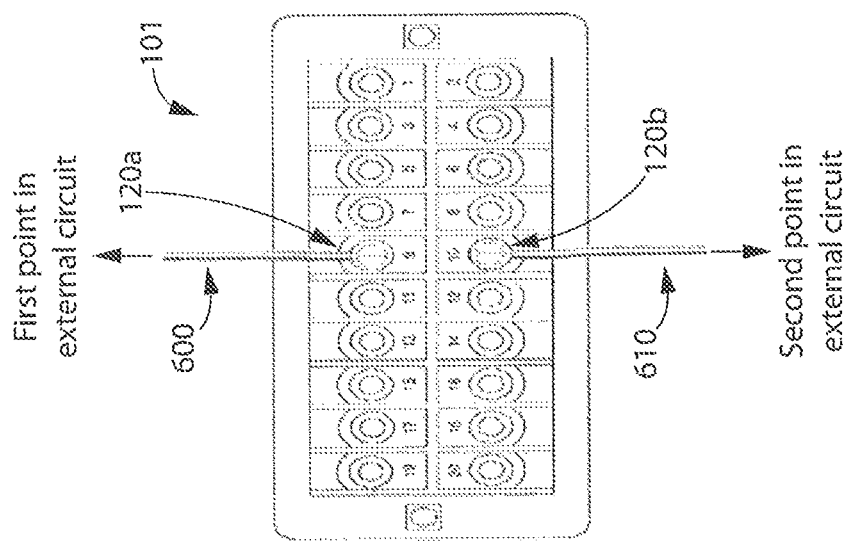
FIG. 1B depicts a bottom view of a first exemplary test switch base according to at least one embodiment of the invention.

Referring to the drawings in detail, wherein like reference numerals indicate like elements throughout, there is shown in FIGS. 1-15, a signal analyzer in the form of a test switch signal analyzer, a method of selectively transmitting an electrical signal, a method of installing a test switch signal analyzer, a method of assembling a test switch signal analyzer and a method of synchronizing wireless devices in accordance with exemplary embodiments of the present invention.

Aspects of the present disclosure describes equipment that can monitor, record and deduce power network activity using equipment that does not require substantial renovation to existing power test switch apparatus.

In some embodiments, the test switch signal analyzer is configured to integrate with existing equipment, monitor and record network activity, and be installed with relatively little-to-no additional substation wiring. One test switch signal analyzer, for example, may be integral with a test switch cover configured to replace a traditional test switch cover. Using embodiments of the test switch signal analyzer described herein, a user can monitor and record network activity without replacing existing equipment or adding significant amounts of new wiring.

Figure 1A:
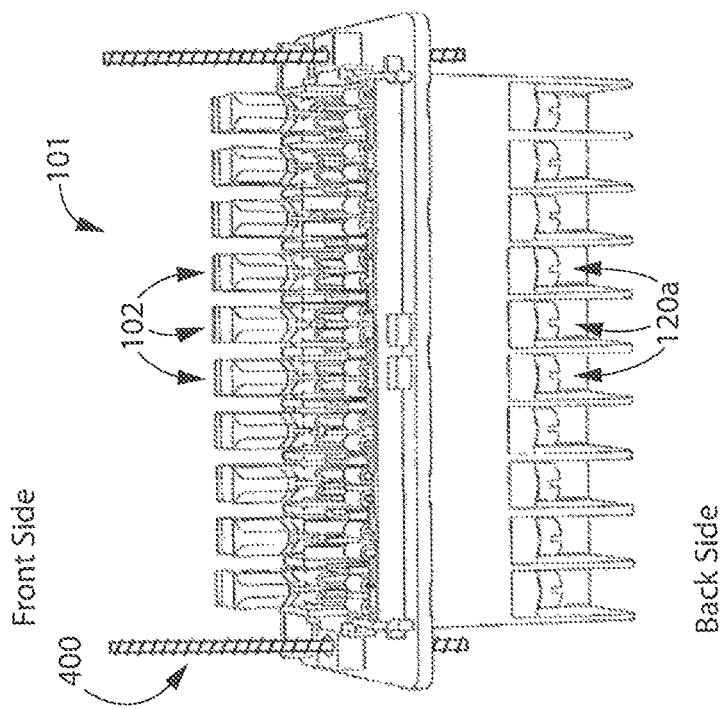
FIG. 1A depicts a perspective view of a first exemplary test switch base according to at least one embodiment of the invention.

In some embodiments, the test switch signal analyzer is attachable or securable to a test switch base. FIGS. 1A-1B depict different views of a first exemplary test switch base 101 (blade style) according to at least one embodiment of the invention. For example, FIG. 1A depicts a perspective view of a first exemplary test switch base 101 according to at least one embodiment of the invention and FIG. 1B depicts a bottom view of a first exemplary test switch base 101 according to at least one embodiment of the invention.

The test switch base 101 may include an attachment component 400 (e.g., mounting posts), a plurality of test switch conductors 102, a plurality of first terminals 120a and a plurality of corresponding second terminals 120b that form a connection terminal pair.

In one embodiment, the attachment component 400 attaches the test switch base 101 to other objects (e.g., a test switch cover, a test switch analyzer and/or an analyzer hub as described herein). In one embodiment, the test switch base 101 is releasably attachable or couplable to a test switch cover (not shown) or a test switch analyzer (not shown) via attachment component 400.

The plurality of test switch conductors 102 are disposed on a first side (e.g., front side) of test switch base 101. The plurality of connection terminal pairs are disposed on a second side (e.g., back side) of test switch base 101. The connection terminal pairs are adapted to connect to wiring 600 and 610 from the back side of the test switch base 101. The connection terminal pairs are convenient for providing connections to relays, meters and instruments.

Each illustrated test switch conductor 102 electrically couples a first terminal (e.g., first terminal 120a) to a second terminal (e.g., second terminal 120b) to form a connection terminal pair. In one embodiment, test switch conductor 102 electrically couples a connection terminal pair when an electrical signal can traverse from first terminal 120a to second terminal 120b. Each illustrated test switch conductor 102 and corresponding first terminal 120a and second terminal 120b electrically connect a first point in an external circuit to a second point in an external circuit when test switch conductor 102 simultaneously electrically contacts first terminal 120a and second terminal 120b.

In some embodiments, each test switch conductor 102 has a CLOSED position and an OPEN position. Engineers open and close test switch conductors as part of normal routine test and maintenance activities in order to electrically isolate the equipment being tested. While open, the equipment is tested through the open test switch pole. When testing is complete, the test switch pole is closed and the tested equipment can then be put back in service.

FIGS. 1C and 1D show the CLOSED and OPEN positions of the test switch conductor 102 according to at least one embodiment of the invention. FIG. 1C depicts a side view of a first exemplary test switch base having a test switch conductor 102 in a CLOSED position. FIG. 1D depicts a side view of a first exemplary test switch base having a test switch conductor 102 in an OPEN position.

When the test switch conductor 102 is in the CLOSED position, the test switch conductor 102 electrically couples the corresponding first terminal 120a of the terminal pair to the corresponding second terminal 120b of the terminal pair by contacting the first terminal 120a and the second terminal 120b simultaneously. The test switch conductor 102 is in the CLOSED position when the non-shorting knife blade 103 contacts the first terminal 120a and the second terminal 120b simultaneously. When the test switch conductor 102 is in the CLOSED position, an electrical current propagates from a first point in an electrical network via wiring 600 to a second point in an electrical network via wiring 610 (shown in FIG. 1B) by creating an electrically-conducting circuit path from a first terminal 120a in the test switch base to a second terminal 120b in the test switch base.

Figure 2A:
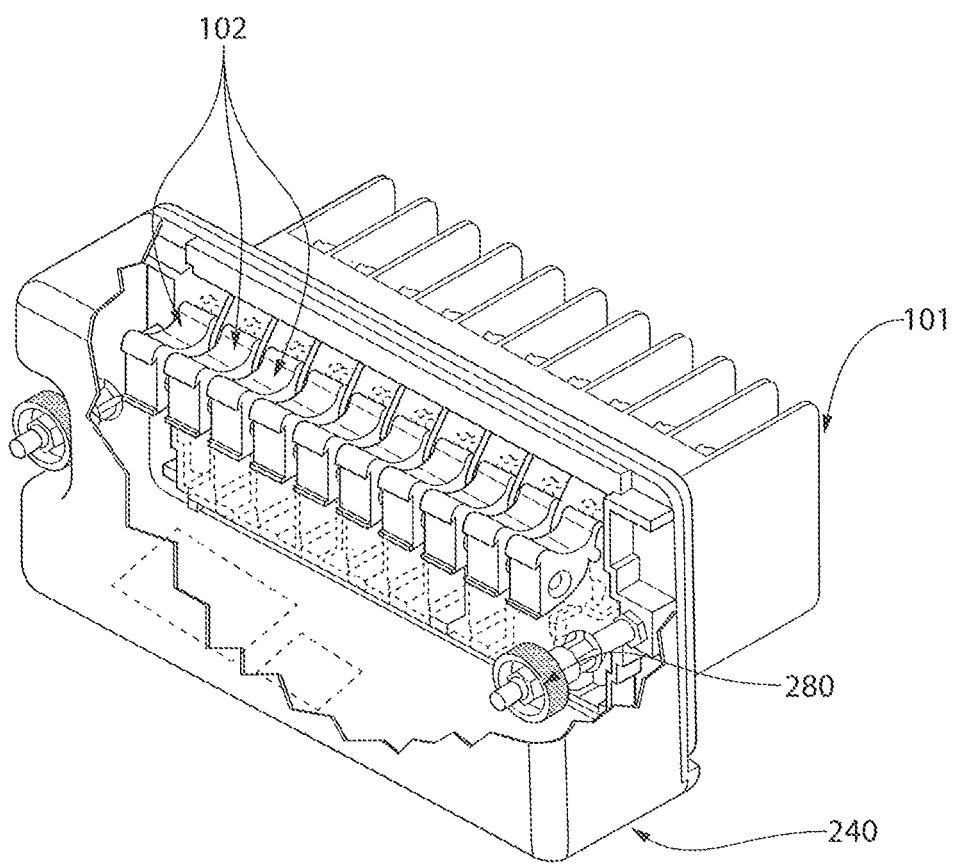
FIG. 2A depicts the exemplary test switch base of FIGS. 1A-1B that releasably attaches or secures to a test switch cover according to at least on embodiment of the invention.

When the test switch conductor 102 is in the OPEN position, the conductor 102 prevents electrical current from flowing between the first point in an external circuit and the second point in the external circuit by creating an open-circuit condition between a first terminal 120a and a second terminal 120b. In one embodiment, an open-circuit condition means there is no electrical connection between first terminal 120a and second terminal 120b and electrical current cannot flow between the two terminals 120a and 120b. The test switch conductor 102 is in the OPEN position when the non-shorting knife blade 103 does not contact the first terminal 120a and the second terminal 120b simultaneously. An open-circuit condition is created when the test switch conductor 102 is separated from one of: a first terminal 120a and a second terminal 120b such that the test switch conductor 102 does not contact at least one of: a first terminal 120a and a second terminal 120b. FIG. 2A depicts the exemplary test switch base of FIGS. 1A-1B that releasably attaches to a test switch cover 240 according to at least on embodiment of the invention. In this embodiment, a portion of test switch cover 240 is cut-out for illustrative purposes to show test switch conductors 102 of test switch base 101. In this embodiment, test switch cover 240 is mountable (e.g., attachable and detachable) to test switch base 101 via mounting component 280 (e.g., a knob) that couples to attachment component 400 (shown in FIG. 1A) of test switch base 101.

In some embodiments, test switch cover 240 and/or test switch base 101 may include an interface comprised a pliable material that environmentally or hermetically seals test switch conductors 102 and any other components disposed in the cavity formed by test switch cover 240 and test switch base 101 when test switch cover 240 is coupled to test switch base 101. In one embodiment, when test switch cover 240 is mounted to test switch base 101, the interface constricts to provide an environmental or hermitic seal between the test switch cover 240 and the test switch base 101 such that the mating surface of test switch cover 240 is fully contoured to the mating surface of the test switch base 101. In some embodiments, the interface helps prolong the working life of sensitive electrical contacts such as test switch conductor 102 by providing an airtight seal to prevent harsh environments from entering the internal test switch chamber. Harsh environments, especially salty or humid environments reduce the working life of electrical contacts by eroding the surface metal of the contacts.

Figure 2B:
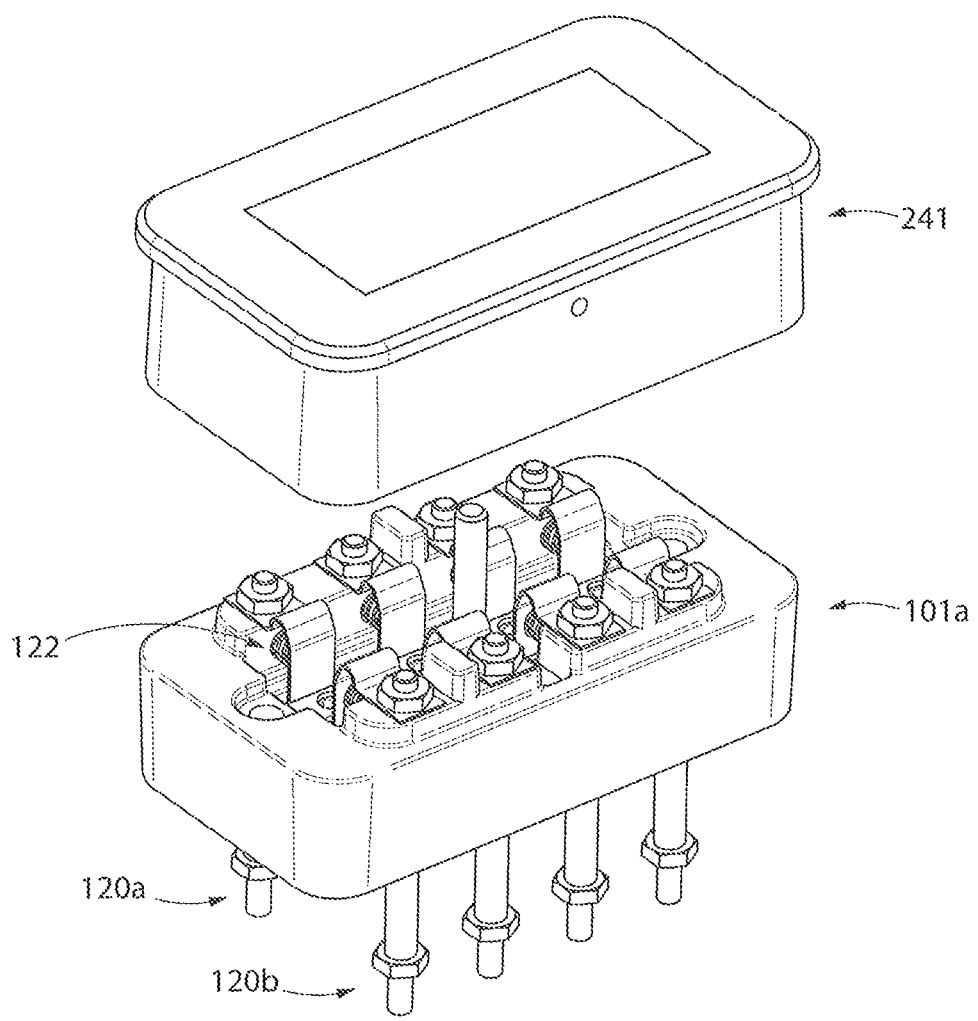
FIG. 2B depicts a second exemplary test switch base that releasably attaches to a test switch cover according to at least one embodiment of the invention.

FIG. 2B depicts an exemplary test switch base 101a (non-blade style) that releasably attaches to a test switch cover 241 according to at least one embodiment of the invention.

The exemplary test switch base 101a includes a plurality of test switch conductors 122, a plurality of first terminals 120a and a plurality of corresponding second terminals 120b that form connection terminal pairs.

Test switch cover 241 also includes test switch cover conductors (not shown) which are aligned with the test switch conductors 122. The test switch conductors 122 and the test switch cover conductors are configured to contact when the test switch cover 241 is secured (e.g., attached) to test switch base 101a. The test switch conductors 122 and the test switch cover conductors electrically couples first terminal 120a to second terminal 120b when the test switch cover 241 is secured or connected to test switch base 101a. This electrical coupling is similar to the coupling of test switch conductor 102 of FIG. 1C being in the CLOSED position in test switch base 101. In one embodiment, the test switch conductors 122 and the test switch cover conductors do not electrically couple first terminal 120a to second terminal 120b when the test switch cover 241 is removed from or disconnected from test switch base 101a. This electrical connection is similar to the test switch conductor 102 of FIG. 1D being in the OPEN position.

Figure 3:
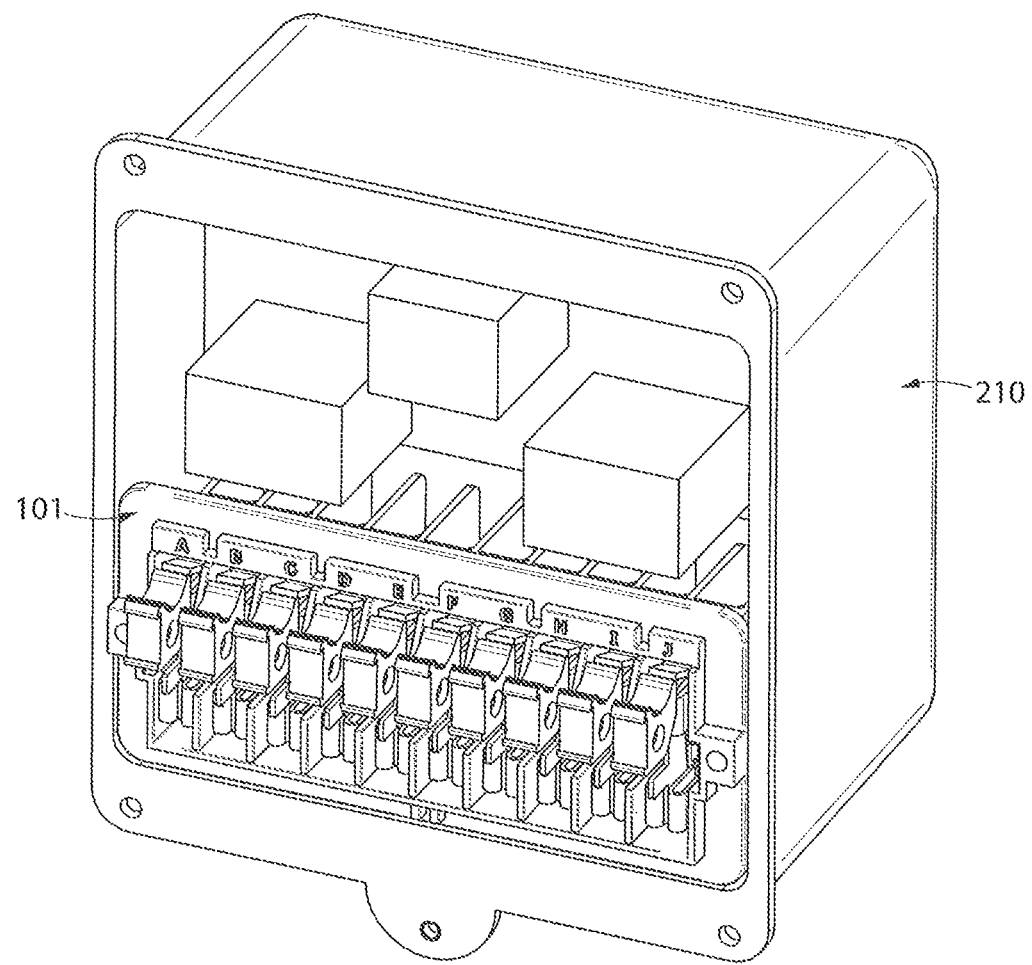
FIG. 3 shows a first exemplary test switch base integrated into a relay according to at least one embodiment of the invention.

Test switch base 101 and/or test switch base 101a can be integrated into different electronic components. In some embodiments, an electronic component is at least one of a control panel, a substation relay, or an electric meter. As an example, FIG. 3 shows a first exemplary test switch base 101 integrated into a relay 210 according to at least one embodiment of the invention.

In one embodiment, test switch cover 240 is mounted on the front side of test switch base 101. The front side of the test switch base 101 corresponds to the side with the test switch conductors 102. In one embodiment, test switch cover 240 is mounted on the back side of test switch base 101. The back side of test switch base 101 corresponds to the side with the terminals 120a and 120b.

Figure 4A:
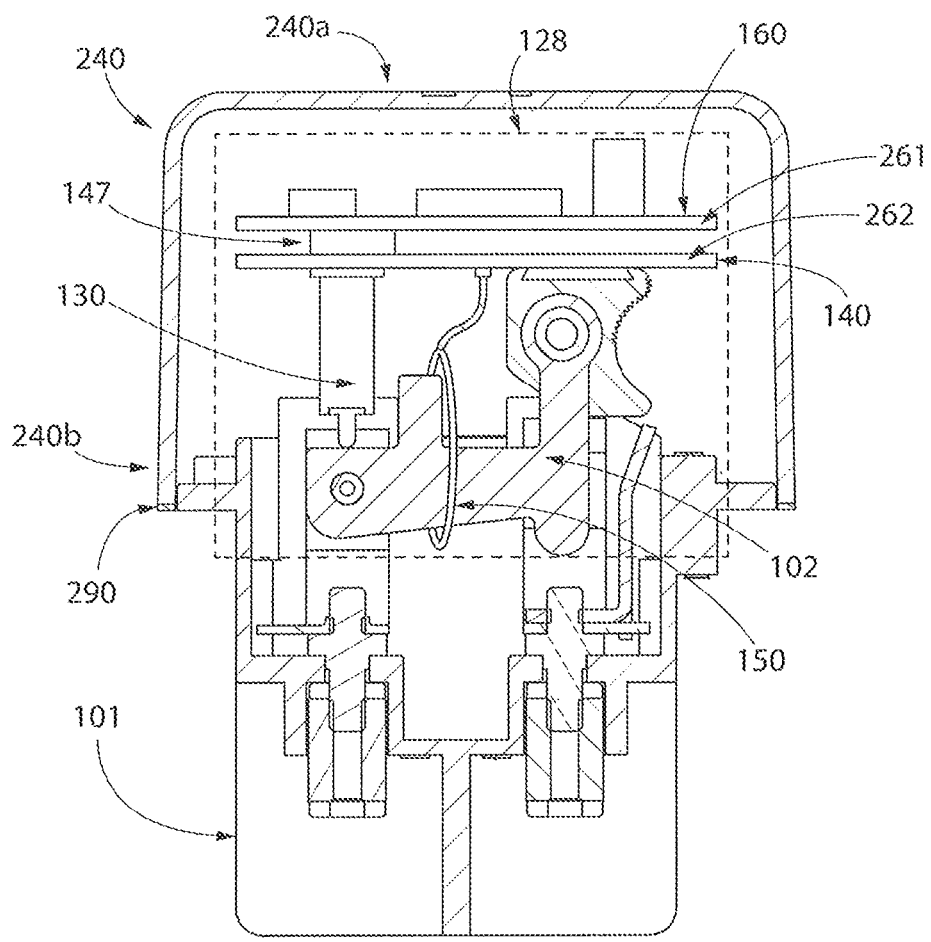
FIG. 4A depicts a cross-section of a test switch base and a test switch cover with a test switch signal analyzer according to at least one embodiment of the invention.

FIG. 4A depicts a cross-section of a test switch base 101 and a test switch cover 240 with a test switch signal analyzer 128 according to at least one embodiment of the invention. In this embodiment, the test switch signal analyzer 128 includes an analyzer hub 140, two signal probes (e.g., voltage probe 130 and current probe 150), and a signal processing unit 160. In FIG. 4A, test switch analyzer 128 is shown in conjunction with first exemplary test switch base 101 and one of the plurality of test switch conductors 102. In some embodiments, the test switch signal analyzer 128 is modified to operate with second exemplary test switch base 101a.

In one embodiment, each signal probe is configured to receive electrical signals from a test switch conductor 102 and generate a probe signal that corresponds to the electrical signal. The voltage probe 130 and the current probe 150 are operatively couplable to the analyzer hub 140 and couplable to one of the test switch conductors 102. When the signal probe is coupled to test switch conductor 102, an electrical connection is made between the test switch conductor 102 and the analyzer hub 160 via the signal probe. While the embodiment in FIG. 4A shows the voltage probe 130 and the current probe 150 connected to the same test switch conductor 102, in some embodiments, the voltage probe 130 and the current probe 150 are connected to different test switch conductors 102.

The analyzer hub 140 is configured to transfer probe signals from the signal probe to the signal processing unit 160. In one embodiment, the analyzer hub 140 is operably couplable with a test switch base 101 having a plurality of test switch conductors (e.g., test switch conductor 102) via an attachment component (e.g. attachment component 400 shown in FIG. 1A).

The signal processing unit 160 is couplable to the analyzer hub 160 and configured to receive one or more probe signals from at least one signal probe. The probe signals are electrical signals that correspond to the electrical signal at the test switch conductor 102 to which the signal probe is coupled. The signal processing unit 160 is configured to sample a plurality of electrical signals received from the at least one signal probe to derive different electrical signal values (as explained in more detail below).

The signal processing unit 160, the analyzer hub 140, and at least a portion of the at least one signal probe are positionable within a removable test switch cover 240. In one embodiment, the signal processing unit 160, the analyzer hub 140, and at least a portion of the at least one signal probe are configured and dimensioned to mate with the test switch base 101 when the at least one signal probe is coupled to one of the test switch conductors 102 and said test switch cover 240 is removably secured to the test switch base 101. In this embodiment, the test switch cover 240 encloses a front of the test switch signal analyzer 128 when the test switch cover is removably secured to the test switch base. By disposing the test switch signal analyzer 128 in the test switch cover 240 and by making the test switch cover 240 removable from the test switch base 101, the test switch analyzer 128 can be efficiently secured to or removed from the test switch base 101 and the test switch conductors 102.

Figure 4B:
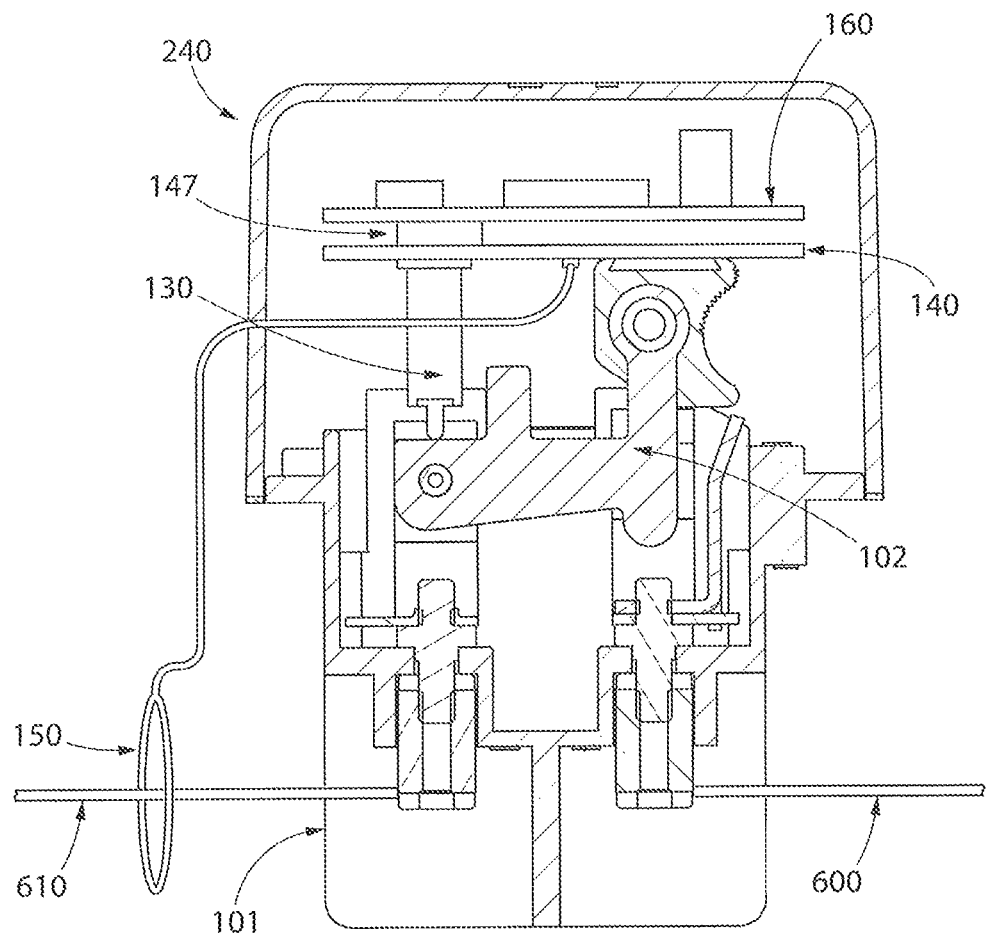
FIG. 4B depicts a cross-section of a test switch base and a test switch cover with a test switch signal analyzer according to at least one embodiment of the invention.
Figure 4C:
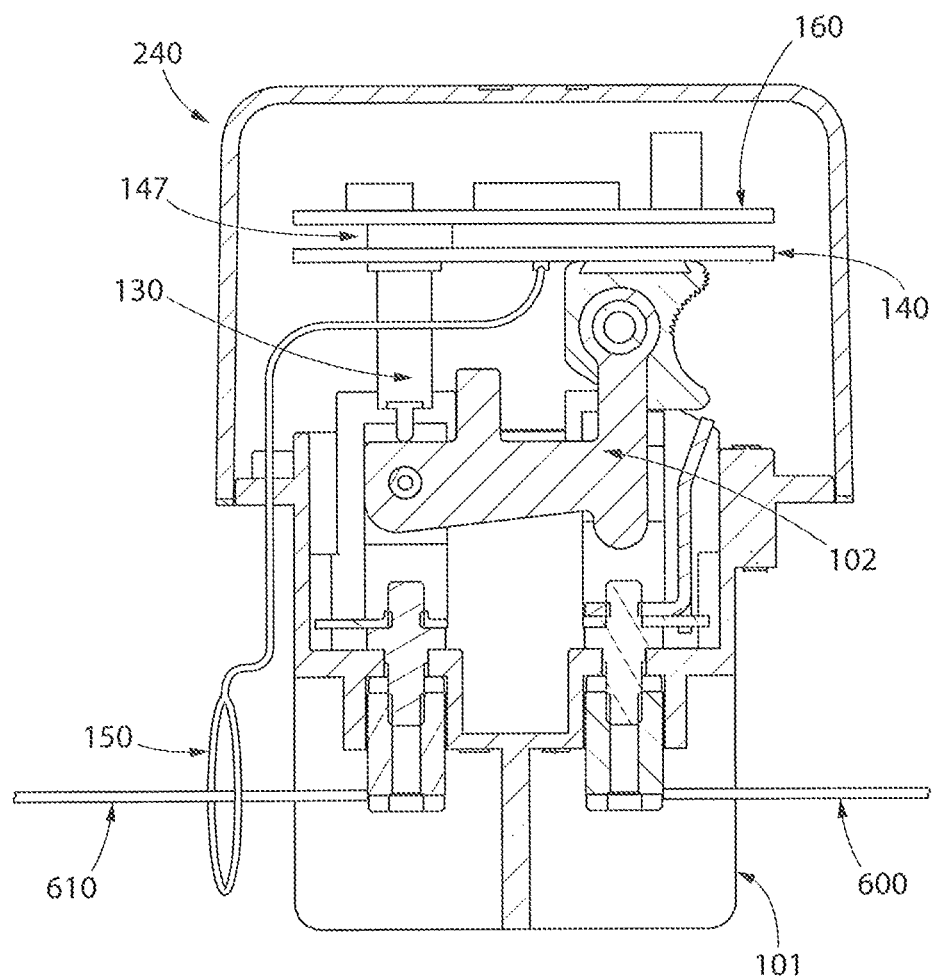
FIG. 4C depicts a cross-section of a test switch base and a test switch cover with a test switch signal analyzer according to at least one embodiment of the invention.

Current probe 150 is couplable to test switch conductor 102 in a number of different configurations. For example, in FIG. 4A, current probe 150 is coupled to a non-shorting knife blade of test switch conductor 102. In FIGS. 4B-4C, current probe 150 is coupled to wiring 610 which, in turn, is coupled to test switch conductor 102. In alternative embodiments, current probe 150 is couplable to wiring 600 or 610 external to test switch base 101. In any of these configurations, current probe 150 receives electrical signals from a test switch conductor 102.

In embodiments where current probe 150 is coupled to wiring 600 or 610, current probe 150 extends through an aperture in test switch cover 240 (as shown in FIG. 4B) or through an aperture in test switch base 101 (as shown in FIG. 4C). Alternatively, current probe 150 extends through an opening between test switch cover 240 and test switch base 101. In these embodiments, current probe 150 is couplable to wiring 600 and 610 while other components of test switch signal analyzer 128 are disposed within test switch cover 240.

In one embodiment, the test switch cover 240 includes a perimeter engagement surface 290 (as shown in FIG. 4A) configured and dimensioned such that substantially all of the perimeter engagement surfaces contact one of: the test switch base 101, control panel, a substation relay, or an electric meter, when the test switch cover 240 is secured to the test switch base 101. The advantage of this configuration is that the test switch cover 240 does not utilize additional space than the space contemplated by the original design of the test switch base, control panel, substation relay or meter. Different embodiments of the test switch signal analyzer include one or more components shown in FIG. 4A or include integration of one or more components. In some embodiments, signal processing unit 160 is integral to a test switch cover (e.g., test switch cover 240 and test switch cover 241). In some embodiments, analyzer hub 140 is integral to a test switch cover (e.g., test switch cover 240 or test switch cover 241). In some embodiments, analyzer hub 140 is integral to a signal processing unit 160. In some embodiments, the at least one signal probe is integral to the test switch cover (e.g., test switch cover 240 and test switch cover 241). In some embodiments, the at least one signal probe is integral to analyzer hub 140.

Figure 4D:
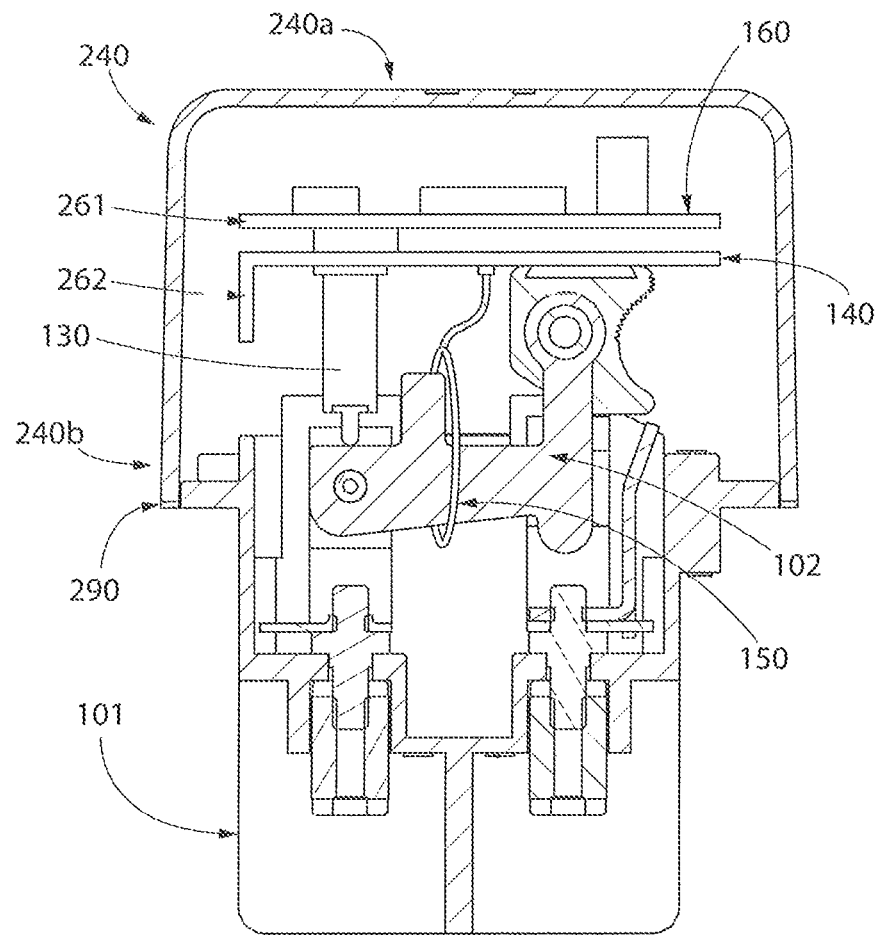
FIG. 4D depicts a cross-section of a test switch base and a test switch cover with a test switch signal analyzer of FIG. 4A where components of test switch signal analyzer have an L-shape according to one embodiment of the invention.
Figure 4E:
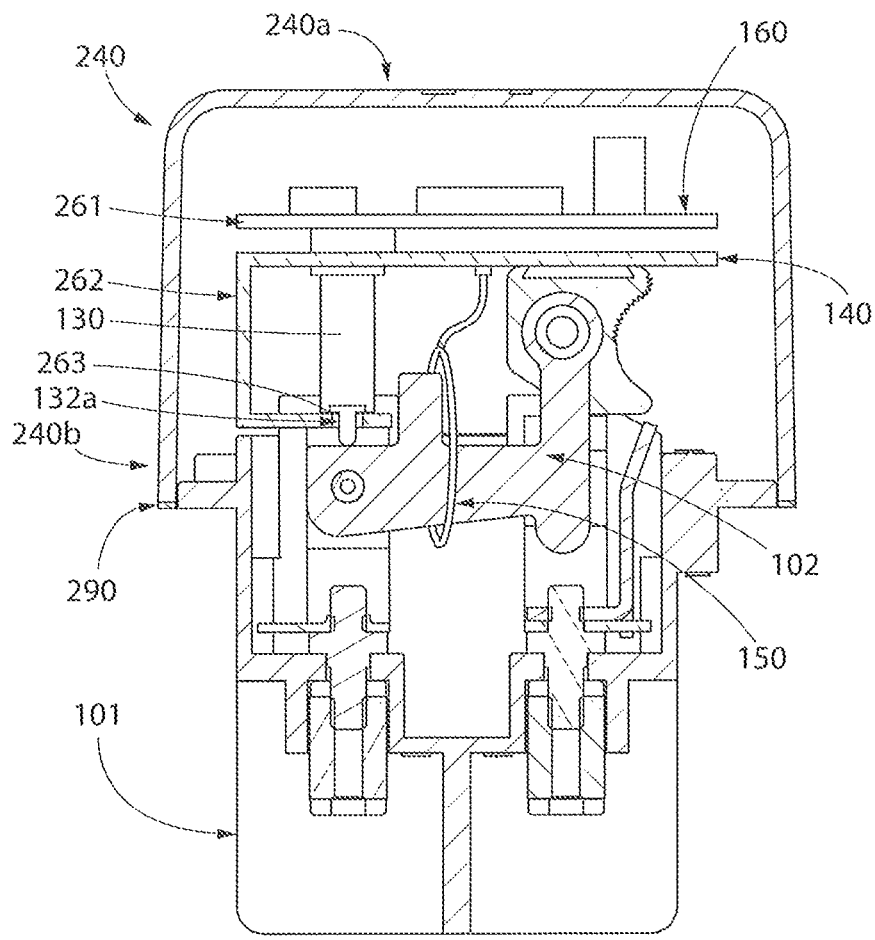
FIG. 4E depicts a cross-section of a test switch base and a test switch cover with a test switch signal analyzer of FIG. 4A where components of test switch signal analyzer have a U-shape according to one embodiment of the invention.

In some embodiments, the signal processing unit 160 and/or the analyzer hub 140 and each include a printed circuit board (e.g., printed circuit boards 261 and 262 shown in FIGS. 4A, 4D and 4E). In some embodiments, the printed circuit board 261 of signal processing unit 160 is an L-shape or U-shape in cross-section and extends along top wall 240a and sidewall 240b of test switch cover 240. In some embodiments, the printed circuit board 262 of analyzer hub 140 is an L-shape or U-shape and extends along top wall 240a and sidewall 240b of test switch cover 240. An example of the printed circuit board 262 of analyzer hub 140 having an L-shape is shown in FIG. 4D. An example of the printed circuit board 262 of analyzer hub 140 having a U-shape is shown in FIG. 4E. In this embodiment, printed circuit board 262 includes an aperture 263. In one embodiment, voltage probe 130 includes a contact 132 (e.g., a pin) that extends through aperture 263 and couples voltage probe 130 with test switch conductor 102. These configurations maximizes the limited space in the test switch cover 240 so that other components, such as voltage and current probes can be disposed within the test switch cover 240.

Figure 5:
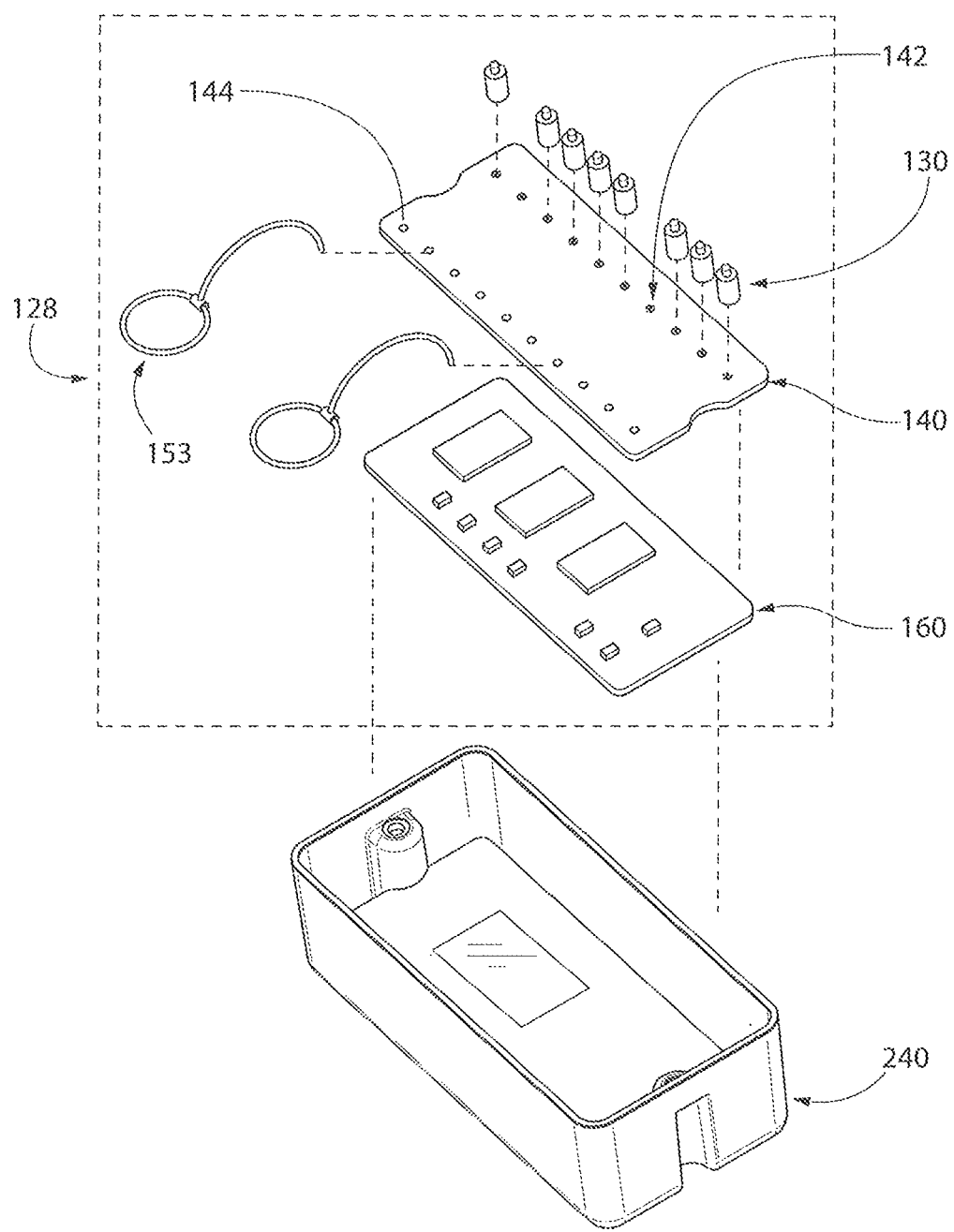
FIG. 5 depicts an exploded view of test switch signal analyzer and test switch cover according to at least one embodiment of the invention.

FIG. 5 depicts an exploded view of test switch signal analyzer 128 and test switch cover 240 according to at least one embodiment of the invention. In FIG. 5, there is shown voltage probe 130, Rogowski coil probe 153, analyzer hub 140, signal processing unit 160 and test switch cover 240.

In one embodiment illustrated in FIG. 5, test switch signal analyzer 128 includes one or more signal probes (e.g., voltage probe 130 and/or Rogowski coil probe 153), an analyzer hub 140 and a signal processing unit 160. In one embodiment, the one or more signal probes are releasably couplable to analyzer hub 140 via coupling components 142 and 144. In one embodiment, signal processing unit 160 is operably couplable to analyzer hub 140. In one embodiment, the signal probe is electrically couplable to signal processing unit 160 via analyzer hub 140 such that electrical signals are transferred from the signal probe to signal processing unit 160.

Test switch signal analyzer 128 is preferably disposable within or between a test switch cover 240 or between test switch cover 240 and test switch base 101. In one embodiment, test switch signal analyzer 128 is integral with test switch cover 240. In one embodiment, test switch signal analyzer 128 and test switch cover 240 are removably couplable to test switch base 101. In addition, when test switch cover 240 is removably secured to test switch base 101, a signal probe is coupled to test switch conductor 102. In one embodiment, when test switch cover 240 is removably secured to test switch base 101, the signal probes are coupled to and receive electrical signals from a test switch conductor 102.

FIGS. 6A-6E depict a test switch cover 240 with exemplary embodiments of different signal probes and an analyzer hub 140 according to different embodiments of the invention.

Figure 6A:
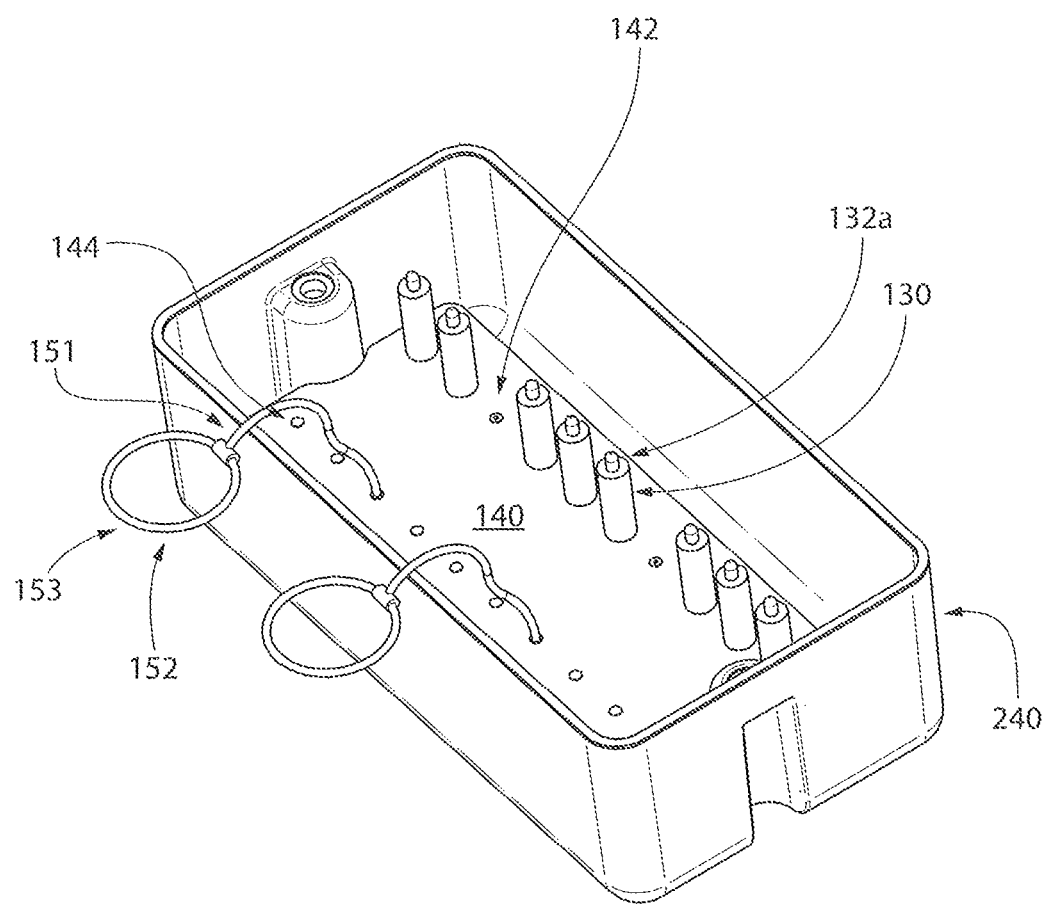
FIGS. 6A depicts a test switch cover with exemplary embodiments of different signal probes (e.g., Rogowski coil and spring-loaded pin voltage probe) and an analyzer hub according to at least one embodiment of the invention.

In one embodiment, as shown in FIG. 6A, the signal probe is a voltage probe 130. In one embodiment, the voltage probe 130 is a conductor that passes current from the test switch conductor 102 to the analyzer hub 140. In one embodiment, to convert the current to a voltage, the value of the current is multiplied by a known impedance (e.g. resistance) of test switch signal analyzer 128.

In the illustrated embodiment, voltage probe 130 is configured to receive electrical signals from one of the test switch conductor 102 and generate a probe signal that corresponds to the voltage characteristic of the electrical signal. In one embodiment the electrical signal is a voltage signal. In operation, when voltage probe 130 is coupled to analyzer hub 140 and contacts (or engages) a non-insulated portion of a test switch conductor 102, voltage probe 130 transfers an electrical signal from test switch conductor 102, when test switch conductor is carrying a voltage, to analyzer hub 140. In one embodiment, one or more voltage probes 130 are configured to contact a non-insulated portion of the test switch conductor when the test switch cover 240 is coupled or secured to the test switch base 101.

In some embodiments, voltage probe 130 includes contact 132a or 132b (i.e., contact portion) that contacts the test switch conductor 102 and an input portion that is removably couplable to analyzer hub 140. In one embodiment, as shown in FIG. 6A, voltage contact 132a includes a spring-loaded pin, making voltage probe 130 retractable. In one embodiment, the voltage probe 130 is part no. 0914-0-15-20-77-14-11-0, manufactured by Mill-Max Manufacturing Corp. In one embodiment, as shown in FIG. 6C, voltage contact 132b includes a spring-loaded clip which clamps to test switch conductor 102.

One or more current signal probes 150 are configured to receive electrical signals from one of the test switch conductors 102 and to generate a probe signal that corresponds to the electrical signal. In one embodiment the electrical signal is a current signal. Exemplary current signal probes include a Rogowski coil 153, CT probe 158 and two-sided slotted probe 155 (see FIGS. 6A-6C).

FIG. 6A shows a Rogowski coil 153 as a current signal probe. In one embodiment, the Rogowski coil 153 is part no. RCTi-3ph, manufactured by RCTi-3ph. A Rogowski coil generates a current probe signal by sensing a magnetic field caused by electrical current flowing in test switch conductor 102. The magnetic field produces a voltage on the coil which, in turn, sends a current signal (i.e. probe signal) into the test switch signal analyzer 128. The current level is a function of the voltage on the Rogowski coil probe 153 divided by the impedance of the test switch signal analyzer 128.

In operation, the Rogowski coil probe 153 is couplable to a test switch conductor 102 by wrapping a coil 152 at a distal end of the Rogowski coil probe 153 around test switch conductor 102 such that test switch conductor 102 passes through the air core of coil 152. The Rogowski coil probe 153 also includes a proximal end operably couplable to analyzer hub 140 via coupling component 144. In this configuration, Rogowski coil probe 153 receives electrical signals (e.g. current electrical signals) propagating through the test switch conductor 102 and transmits corresponding probe signals to analyzer hub 140 when test switch conductor 102 is carrying a current, the test switch cover 240 is secured to the test switch base 101 and a proximal end of the Rogowski coil probe 153 is operably coupled to the analyzer hub 140. The probe signals from the Rogowski coil probe 153 correspond to the amount of electrical current flowing through the test switch conductor 102.

Alternatively, the Rogowski coil probe 153 is couplable to test switch conductor 102 by wrapping the coil 152 around wiring 600 or wiring 610 (as shown in FIG. 4B). In some embodiments, coil 152 includes a detachable end. In this embodiment, a user wraps the coil 152 around wiring 600 or 610 while the detachable end is detached and then reattaches the detachable end to create the air core of coil 152. In some embodiments, to connect Rogowski coil 153, a user disconnects wiring 600 or 610, inserts wiring 600 or 610 through the air core and then reconnects wiring 600 or 610. Regardless of the type of Rogowski coil probe 153 or installation method, the Rogowski coil probe 153 is couplable to test switch conductor 102 via wiring 600 or 610.

The Rogowski coil probe 153 includes an insulated cable 151 and a coil 152 connected to an end of the insulated cable 151. In one embodiment, the insulated cable 151 is comprised of flexible material which is releasably couplable with, and detachable to, analyzer hub 140. The Rogowski coil probe 153 is preferably flexible to permit placement in areas of tight tolerance.

In one embodiment, the Rogowski coil probe 153 includes an RJ connector at one end of the insulated cable 151 that is couplable with analyzer hub 140. In one embodiment, the RJ connector is part no. 73306-111LF, manufactured by FCI. In one embodiment, the RJ connector is attachable and detachable from analyzer hub 140 using one hand of a user. As a result, a user can hold test switch cover 240 in one hand while removing the Rogowski coil probe 153 using the other hand.

Figure 6B:
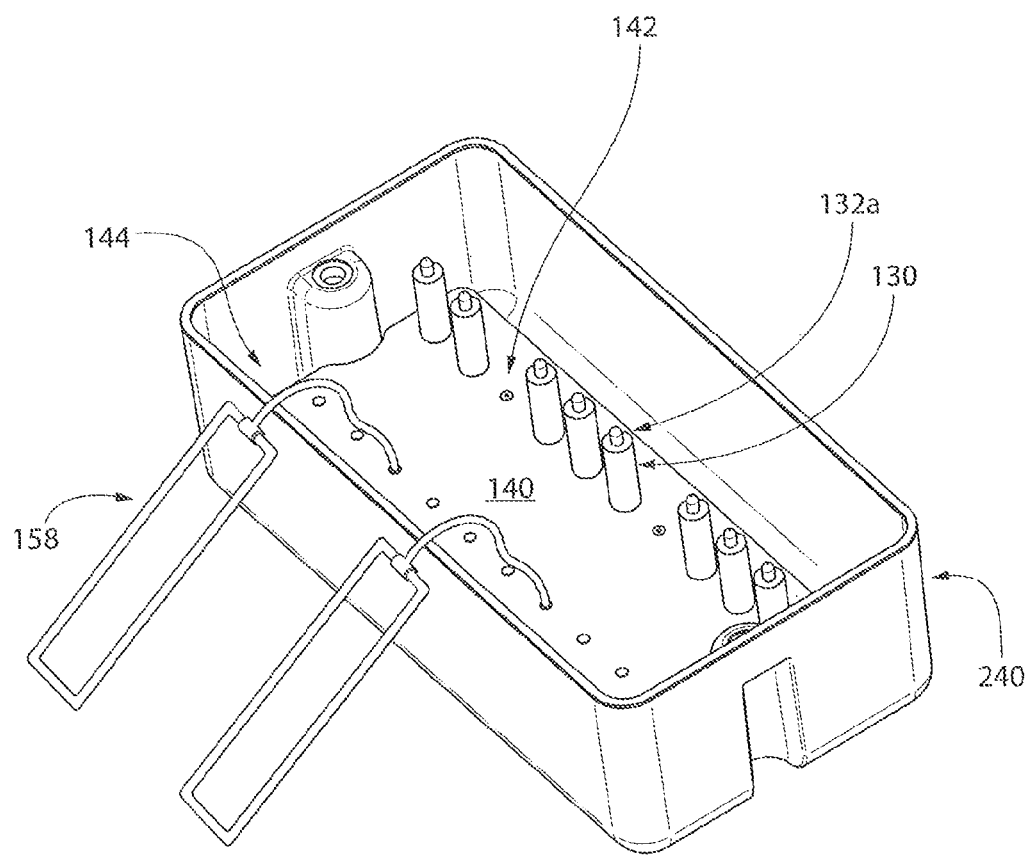
FIGS. 6B depicts a test switch cover with exemplary embodiments of different signal probes (e.g., CT probe and spring-loaded pin voltage probe) and an analyzer hub according to at least one embodiment of the invention.
Figure 6C:
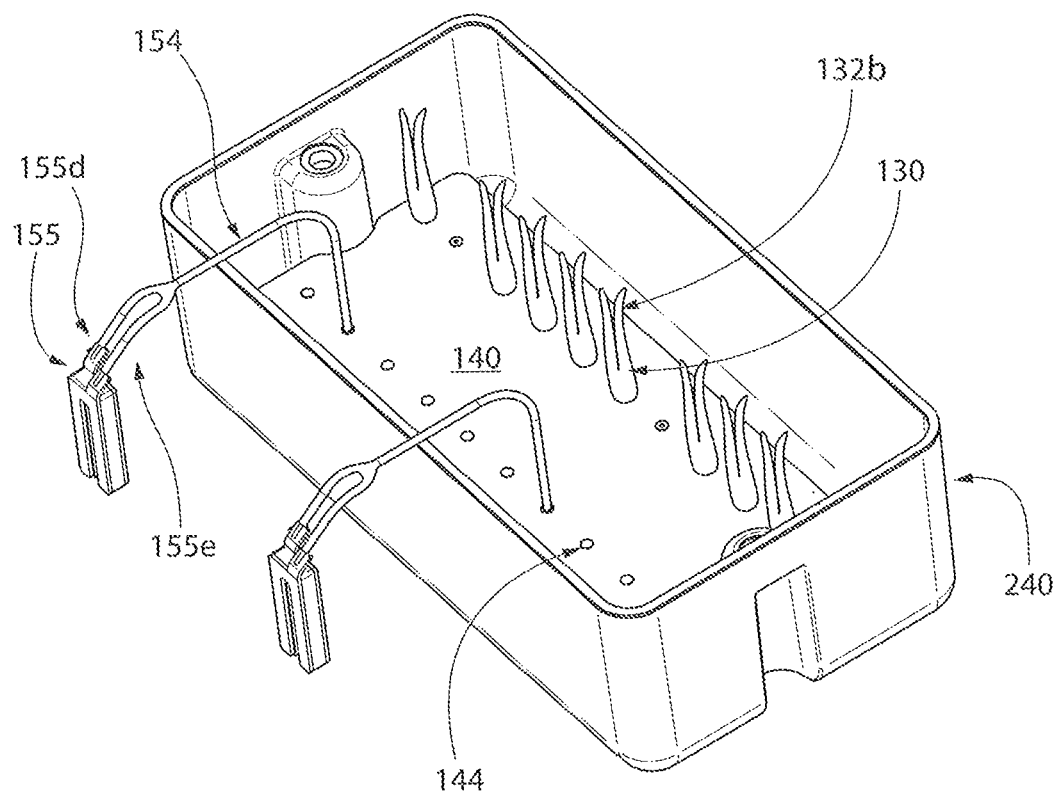
FIGS. 6C depicts a test switch cover with exemplary embodiments of different signal probes (e.g., slotted current probe and spring-loaded clip voltage probe) and an analyzer hub according to at least one embodiment of the invention.

FIG. 6B shows a current transformer ("CT") probe 158 as a current signal probe. The CT probe 158 includes many of the same components and functionality as the Rogowski coil probe 153, except that the CT probe 158 has a solid core (e.g., iron or steel manufactured into a loop) instead of a wire coil 152. A solid core has a higher magnetic permeability, resulting in a greater electrical efficiency, as compared to coil 152. Thus, CT probe 158 measures lower level current signals as compared to the Rogowski coil 153.

Figure 6D:
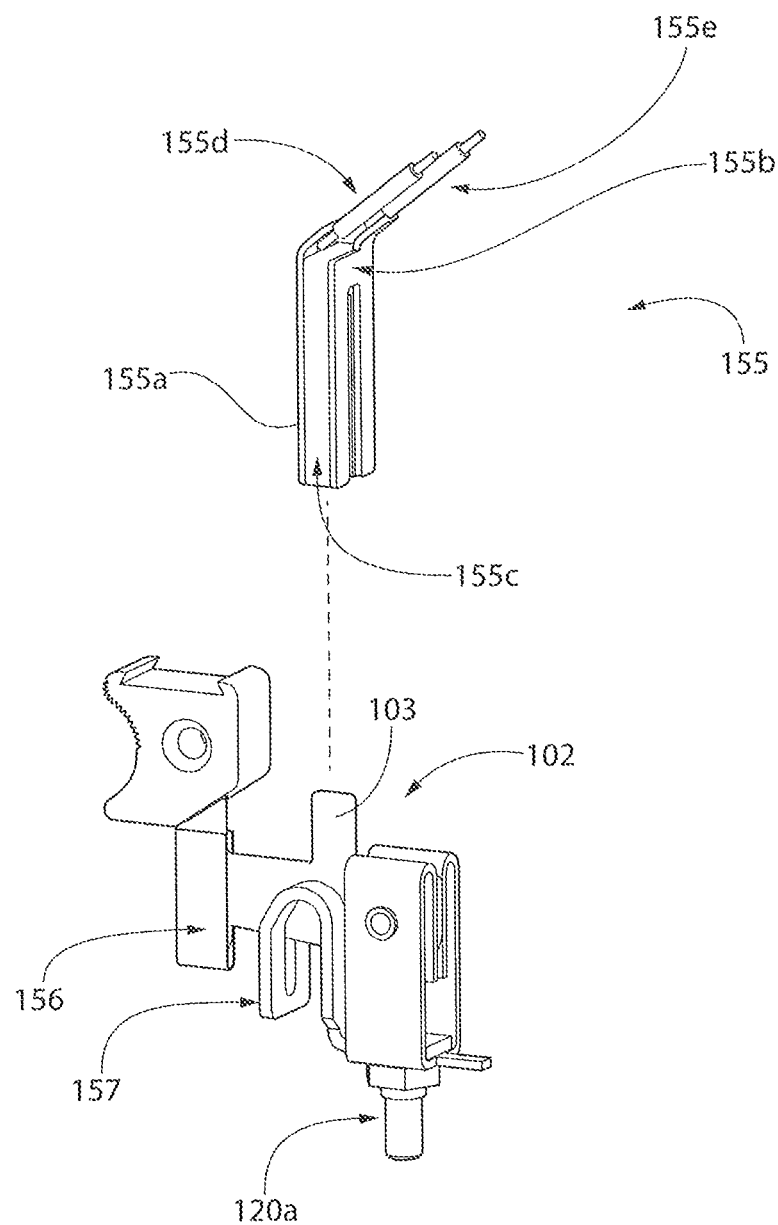
FIG. 6D depicts a two-sided slotted probe and a test switch conductor according to at least one embodiment of the invention.

In one embodiment, as shown in FIGS. 6C-6D, a signal probe is a two-sided slotted probe 155. The two-sided slotted probe 155 includes an insulated cable 154 which can be releasably coupled with analyzer hub 140. The insulated cable 154 includes an input wire and an output wire (not shown). The insulated cable 154 also includes leads 155d and 155e, each connecting to either the input wire or the output wire.

As shown in FIG. 6D, two-sided slotted probe 155 includes a first electrically conducting face 155a and a second electrically conducting face 155b. The first electrically conducting face 155a and second electrically conducting face 155b are connected to insulating cable 154 (not shown) via leads 155d and 155e, respectively. The first electrically conducting face 155a is electrically insulated and spaced apart from the second conducting face 155b by an electrically insulating material 155c disposed between electrically conducting face 155a and second electrically conducting face 155b. In one embodiment, first electrically conducting face 155a is parallel to second electrically conducting face 155b to prevent unintended contact between the first electrically conducting face 155a and the second electrically conducting face 155b.

Figure 6E:
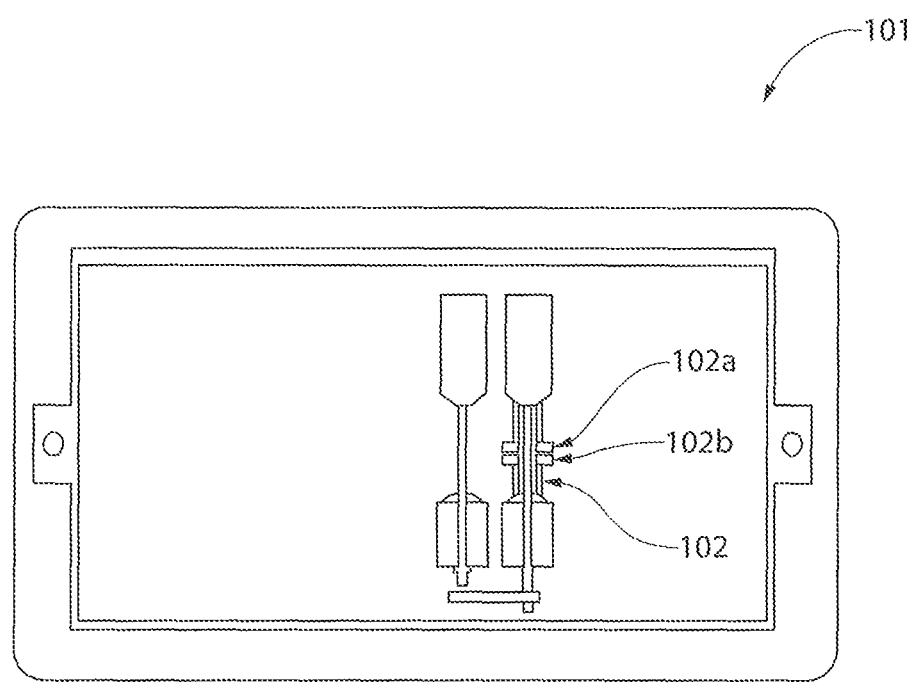
FIG. 6E is a top view of test switch base showing an insertion point for a two-sided slotted probe according to at least one embodiment of the invention.

The first electrically conducting face 155a, second conducting face 155b, and electrically insulating material 155c include a slot to allow the two-sided slotted probe 155 to slidably contact and straddle a test switch conductor 102. An advantage of the two-sided slotted probe 155 is that it is easily decouplable from test switch conductor 102 because of its slidable couplability. In some embodiments, two-sided slotted probe 155 is comprised of a flexible and/or rigid material. The two-sided slotted probe 155 is disposed more easily in test switch cover 240 if probe 155 is comprised of the flexible material, while still maintaining sufficient coupling to test switch conductor 102 because of the rigid material. FIG. 6E is a top view of test switch base 101 showing an insertion point (e.g., between first point 102a and second point 102b) for two-sided slotted probe 155 according to at least one embodiment of the invention. In exemplary operation, the two-sided slotted probe 155 is inserted between a first point 102a on test switch conductor 102 and a second point 102b on test switch conductor 102 such that the two-sided slotted probe 155 slideably straddles test switch conductor 102.

Figure 6F:
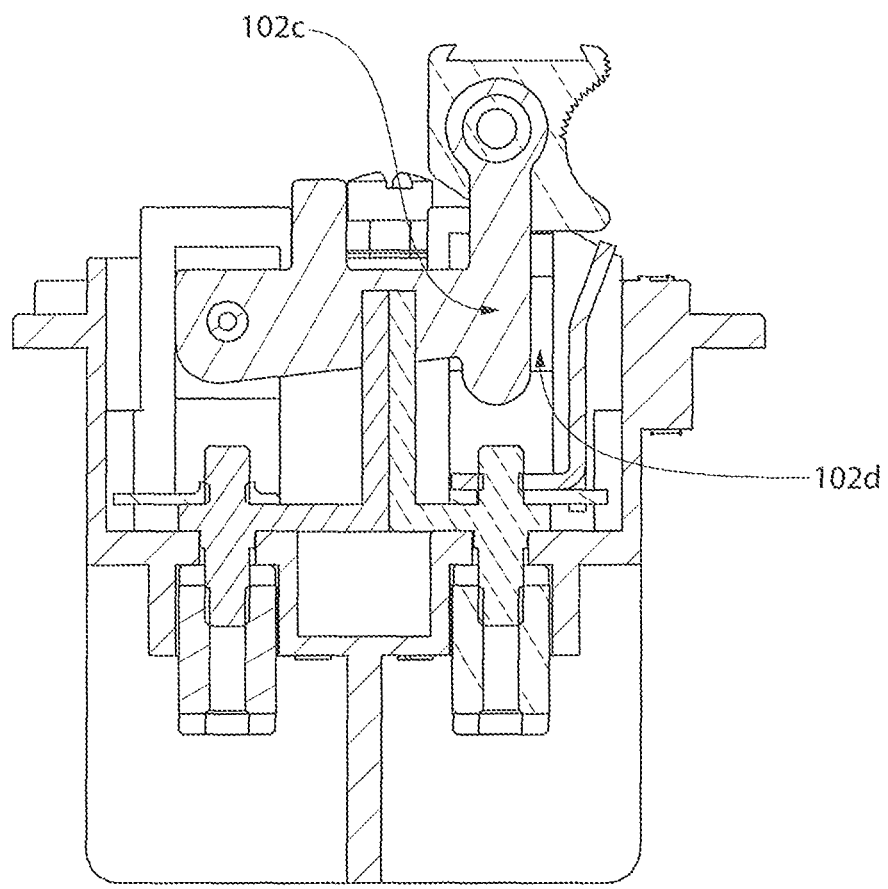
FIG. 6F is a cross-section of a test switch base showing where the insulator is operative to prevent an electrical coupling between two points according to at least one embodiment of the invention.

An insulator 156, shown in FIG. 6D, is also placeable on test switch conductor 102 to prevent an electrical coupling between a first point 102c on test switch conductor 102 to a second point 102d on test switch conductor 102, as shown in FIG. 6F. As an electrical signal propagates through test switch conductor 102, two-sided slotted probe 155 redirects the electrical signal from a first point 102a on test switch conductor 102, into the analyzer hub 140 and signal processing unit 160 via first electrically conducting face 155a, lead 155d and insulated cable 154, and then from the analyzer hub 140 and signal processing unit 160 to a second point 102b on test switch conductor via second electrically conducting face 155b, lead 155e and insulated cable 154. Thus, the two-sided slotted probe 155 is positioned in the electrical path propagated by the electrical signal through test switch conductor 102 such that the two-sided slotted probe 155 can measure the current in the electrical signal.

In one embodiment, illustrated in FIG. 6D, the two-sided slotted probe 155 is configured to slideably straddle the non-shorting knife blade 103 when the non-shorting knife blade 103 is in a CLOSED position such that the two-sided slotted probe 155 is in electrical contact with the current-carrying springs 157 on both sides of the non-shorting knife blade 103. The two-sided slotted probe 155 is installable in electrical contact with the current-carrying springs 157 on either side of the non-shorting knife blade 103, in an installed position that is proximate to an insulator 156 disposed over a portion of the non-shorting knife blade 103. The insulator 156 is configured to prevent electrical contact between the non-shorting knife blade 103 and a terminal 120a of the test switch base 101 even when the non-shorting blade 103 is in the CLOSED position.

In one embodiment, the slot disposed in the two-sided slotted probe 155 and insulator 156 are not required when test switch conductor 102 is in the OPEN position. In this embodiment, a two-sided unslotted probe 155 directly contacts the current-carrying springs 157 without slideably straddling the non-shorting knife blade 103.

Referring back to FIG. 4A, analyzer hub 140 is configured to transfer or exchange probe signals (e.g., voltage signals and current signals) between a signal probe and signal processing unit 160. In one embodiment, analyzer hub 140 transfers probe signals between a signal probe and signal processing unit 160 via a coupling component 142 or 144 for each signal probe, as shown in FIG. 6A, and via coupling component 147 for measurement device 160, as shown in FIG. 4A. Analyzer hub 140 also includes circuit paths between each signal probe coupling component 142 or 144 and measurement device coupling component 147.

In one embodiment, coupling components 142 and 144 are input jacks or contact apertures configured to receive a signal probe. In one embodiment, coupling components 142 and 144 couple to a signal probe when the signal probe contacts the coupling components 142 and 144.

In one embodiment, a voltage probe 130 is positionable on the analyzer hub 140 and alignable with a certain test switch conductor 102. In this embodiment, the voltage probe 130 contacts the certain test switch conductor 102 when the analyzer hub 140 is coupled to the test switch base 101 because of the voltage probe position. In one embodiment, coupling components 142 are arranged in an array such that when the analyzer hub 140 is coupled to the test switch base 101, the voltage probes 130 each make contact with a corresponding test switch conductor 102.

In one embodiment, a current probe 150 is positionable on the analyzer hub 140 and alignable with a certain test switch conductor 102. In this embodiment, the current probe 150 contacts the certain test switch conductor 102 when the analyzer hub 140 is coupled to the test switch base 101 because of the voltage probe position. In one embodiment, coupling components 144 are arranged in an array such that when the analyzer hub 140 is coupled to the test switch base 101, the current probes 150 each make contact with a corresponding test switch conductor 102.

In some embodiments, different components of test switch signal analyzer 128 are detachable and/or attachable. In one embodiment, analyzer hub 140 is detachable from signal processing unit 160. In some embodiments, one or more signal probes are detachable and/or re-attachable from the analyzer hub 140.

In one embodiment, analyzer hub 140 is at least one of: a panel, a circuit board, a portion of a circuit board, a connector (e.g., wire connector), and a mesh of wires. In one embodiment, the printed circuit board includes contact apertures (e.g., input jacks). Each aperture is configured to receive a signal probe such that each signal probe is aligned with a feature of one of the plurality of test switch conductors 102 after the signal probe is received in the contact aperture.

In some embodiments, pre-selected signal probes are coupled with analyzer hub 140 via certain coupling components 142 or 144, based on a user selection. In this embodiment, a pre-selected combination of test switch conductors 102 of test switch base 101 become coupled to analyzer hub 140 when the pre-selected signal probes are coupled to the corresponding test switch conductors. In these embodiments, a user may select a position of one or more signal probes by coupling the signal probes with certain coupling components 142 leaving other coupling components 142 uncoupled to any signal probes. As a result, the configuration and positioning of the probes in a test switch cover 240 can be customized by a user to correspond to different configurations of a test switch base 101.

Figure 7:
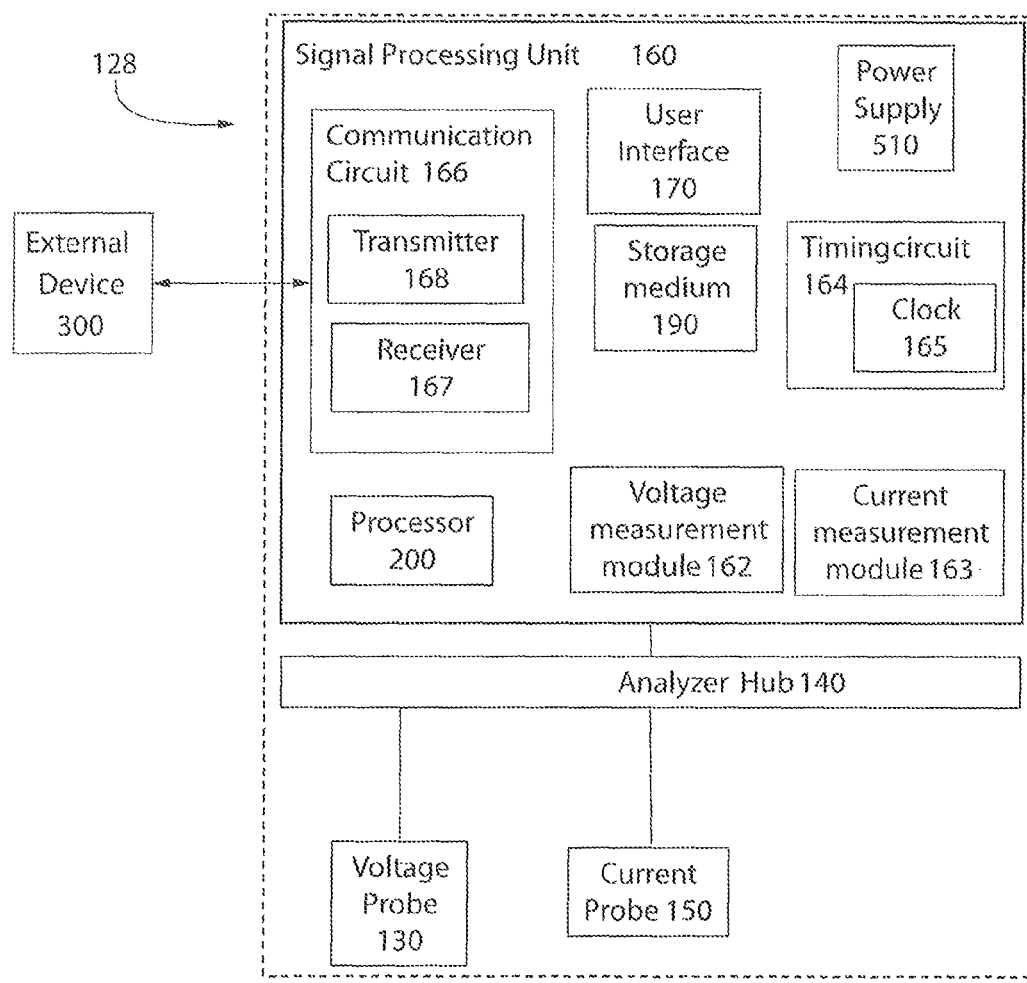
FIG. 7 shows a block diagram of a test switch analyzer having a signal processing unit according to at least one embodiment of the invention.

FIG. 7 shows a block diagram of a test switch analyzer 128 having a signal processing unit 160 according to at least one embodiment of the invention. In this embodiment, test switch analyzer 128 includes a voltage probe 130, a current probe 150, an analyzer hub 140 and a signal processing unit 160. In some embodiments, signal processing unit 160 includes at least one of: voltage measurement module 162, current measurement module 163, time circuit 164, clock 165, communication circuit 166 including receiver 167 and transmitter 168, user interface 170, storage medium 190, processor 200 and power supply 510. In one embodiment, each of these components or modules is connected via a communication infrastructure (e.g., a data bus or computer network). The communication infrastructure is a wired connection or a wireless network.

The signal processing unit 160 is couplable to signal probes 130 and 150 via analyzer hub 140. When coupled, signal processing unit 160 receives electrical probe signals from the signal probes 130 and 150. The electrical probe signals are proportional to the strength of the electrical signals flowing through test switch conductor 102 and received by the signal probes 130 and 150. Signal processing unit 160 is coupled to a voltage probe 130 using voltage measurement module 162. Signal processing unit 160 is coupled to a current probe 150 using current measuring module 163. Voltage measuring module 162 and current measuring module 163 may be any interface device configured to receive electrical signals from a signal probe and transfer the electrical signals to a signal processing unit 160.

In some embodiments, signal processing unit 160 includes processor 200. Processor 200 is any type of processor, including but not limited to a special purpose or a general-purpose digital signal processor. In one embodiment, processor 200 is part no. STM32F429ZI, manufactured by ST Microwave.

In one embodiment, processor 200 includes an analog-to-digital converter configured to sample each probe signal according to a time-based sampling interval (e.g., uniform, random, user-selected). As discussed above, each probe signal is associated with an electrical signal propagating through a test switch conductor 102. Processor 200 generates a set of sampled signal values for each probe signal. In one embodiment, the analog-to-digital converter is part no. ADE7880ACPZ, manufactured by Analog Devices, Inc.

Time measurement circuit 164 associates each sampled signal value with a timestamp indicating when the sampled signal value was generated. Thus, each sampled signal value has a time-based relation to another sampled signal value. The time-based relation is the difference in time between when the two sampled signal values were measured. The time-based relation can be used to recreate waveforms comprised of a plurality of sampled signal values over a period of time (e.g., a voltage sine-wave or a current sine-wave).

In one embodiment, processor 200 generates derived signal values from a set of sampled signal values from a probe signal. Examples of derived signal values generated from a single set of sampled signal values include: voltage, RMS voltage, frequency of voltage, voltage waveforms, current, RMS current, frequency of current, current waveforms, time, harmonics, offset, phasor, phasor measurement unit, phasor amplitude, phasor phase, phasor waveforms, position in a cycle, rate of change of any probe signal and combinations thereof. For example, in one embodiment, processor 200 uses successive sampled signal values to determine the frequency of a probe signal.

In one embodiment, processor 200 generates derived signal values from two or more sets of sampled signal values from two or more probe signals. Examples of derived signal values generated from two or more sets of sampled signal values include: power, average power, real power, reactive power, power waveforms, resistance, impedance, conductance, phase, phasor, phasor measurement unit, phasor amplitude, phasor phase, phasor waveforms, sequence of events and rate-of-change and combinations thereof. Derived signal values from two or more sets of sampled signal values is indicative of the electrical relationship between the electrical signals propagating through two different test switch conductors 102. For example, power is a product of a voltage signal measured from a first test switch conductor and a current signal measured from a second test switch conductor. The derived signal values are used by engineers to determine the cause of any problems in the electrical network and also anticipate any problems in the electrical network.

In some embodiments, processor 200 generates electrical signal records from one or more sets of sampled signal values and/or derived signal values including at least one of: a sequence-of-event record, fault record, and dynamic disturbance record. A sequence-of-event record is comprised of a device's response to an event (e.g., a response by a circuit breaker to an event). A sequence-of-event record includes changes in circuit breaker position (open/close) and a timestamp of when the change in circuit breaker position occurred. A fault record includes individual electrical signal measurements (e.g., sampled signal values) depicting the actual waveform data replicating a system's primary voltages and currents. In some embodiments, a fault record includes phase-to-neutral voltage, phase currents and residual or neutral current. A dynamic disturbance record includes incidents that portray power system behavior during dynamic events such as low-frequency oscillations and abnormal frequency or voltage excursions. In some embodiments, a dynamic disturbance record includes phase-to-neutral voltage, phase currents, frequency and three-phase real and reactive power (MW, MVAR).

In some embodiments, processor 200 generates electrical signal records indicative of the time difference between an electrical signal stimulus on a first of a plurality of test switch conductors 102 and a resultant electrical signal response on a second of the plurality of test switch conductors 102. One example of a time difference between an electrical signal stimulus and an electrical signal response is the time difference between when a relay provides an open-circuit request command to a circuit breaker (e.g., a request to open a circuit) and when the circuit breaker sends a confirmation back to the relay indicating that the circuit breaker had completed this open-circuit request.

In some embodiments, processor 200 compares sampled signal values or derived signal values to at least one predetermined threshold value. In one embodiment, processor 200 generates electrical signal records indicating that an alarm condition exists if one or more sampled signal values or derived signal values exceeds a threshold value. An example of an alarm condition is when a predetermined current or voltage threshold was exceeded by a sampled signal value. The alarm condition values alert engineers to potential problems in an electrical network.

In some embodiments, processor 200 stores sampled signal values, derived signal values and/or electrical signal records at storage medium 190. In some embodiments, processor 200 transmits sampled signal values, derived signal values and/or electrical signal records to external device 300 via communication circuit 166. As a result, the sampled signal values, derived signal values or electrical signal records are available for inspection by engineers for determining the cause of, or for anticipating, any problems in the electrical network.

In the above embodiments, the result of the comparison is indicative of a safe or unsafe condition arising in an electrical network. In some embodiments, if one or more sampled signal values and/or derived signal values exceed a predetermined threshold level, then processor 200 stores the one or more sampled signal values, derived signal values and/or electrical signal records in storage medium 190. In some embodiments, if one or more sampled signal values and/or derived signal values exceed a predetermined threshold level, then processor 200 transmits the one or more sampled signal values, derived signal values and/or electrical signal records to an external device 300 via communication circuit 166. As a result, in these embodiments, only one or more sampled signal values, derived signal values and/or electrical signal records of interest to a user are stored in storage medium 190 or transmitted to external device 300, thereby preserving storage space or limiting the amount of data transmitted to the external device 300.

In one embodiment, processor 200 samples the probe signal at a first sampling rate (e.g., every millisecond) and a second sampling rate (e.g., every two milliseconds) during a time period to create first and second sets of sampled signal values (e.g., first and second representations of the probe signal). After creating the first and second sets of sampled electrical signals, processor 200 calculates a first derived signal value for the first set of sampled electrical signals and a second derived signal value for the second set of sampled electrical signal data.

In some embodiments, processor 200 transmits the first sampled signal values and/or first derived signal value to external device 300. In some embodiments, external device 300 compares the first sampled signal values and/or first derived signal value to a threshold value. External device 300 requests the second sampled signal values and/or second derived signal value from processor 200 if the first sampled signal values and/or first derived signal value exceeds the threshold value. In response to receiving the request, processor 200 transmits the second sampled signal values and/or second derived signal value to external device 300.

In some embodiments, processor 200 compares the first sampled signal values and/or first derived signal value to a threshold value. In some embodiments, processor 200 stores the second derived signal value and/or the second set of sampled signal values at a storage medium 190 if the first sampled signal values and/or first derived signal value exceeds the threshold value. In some embodiments, processor 200 transmits the second derived signal value and/or the second set of sampled signal values to an external device 300 if the first sampled signal values and/or first derived signal value exceeds the threshold value.

In some embodiments, the first set of sampled signal values includes more sampled values than the second set of sampled signal values. In these embodiments, storing the second sampled signal values preserves storage space in storage medium 190 and limits the amount of data transmitted to external device 300. In some embodiments, the first set of sampled signal values includes less sampled values than the second set of sampled signal values. In these embodiments, processor 200 generates derived signal values at a faster rate because processor 200 uses less sampled signal values to generate the derived signal values.

As explained above, test switch signal analyzer 128 includes a communication circuit 166 that is configured to exchange different types of test switch related data with external device 300 via a communication network (e.g., wired or wireless network). In one embodiment, communication circuit 166 includes a receiver 167 and a transmitter 168. Receiver 167 receives test switch related data (e.g., requests for sampled signal values, derived signal values or electrical signal records) from the external device 300. Transmitter 168 transmits test switch related data (e.g., sampled signal values, derived signal values or electrical signal records) to the external device 300. In one embodiment, communication circuit 166 is part no. 450-0053, manufactured by LSR.

In one embodiment, test switch signal analyzer 128 includes an internal power supply 510 (e.g., battery). One advantage of an internal power supply is that the test switch signal analyzer 128 still operates if there is a power outage.

In one embodiment, test switch signal analyzer 128 includes removable storage 192. Examples of removable storage include an SD card, flash drives, hard drives, memory cards. Removable storage provides one method for users to obtain saved electrical signal data created by signal processing unit 160.

Figure 8:
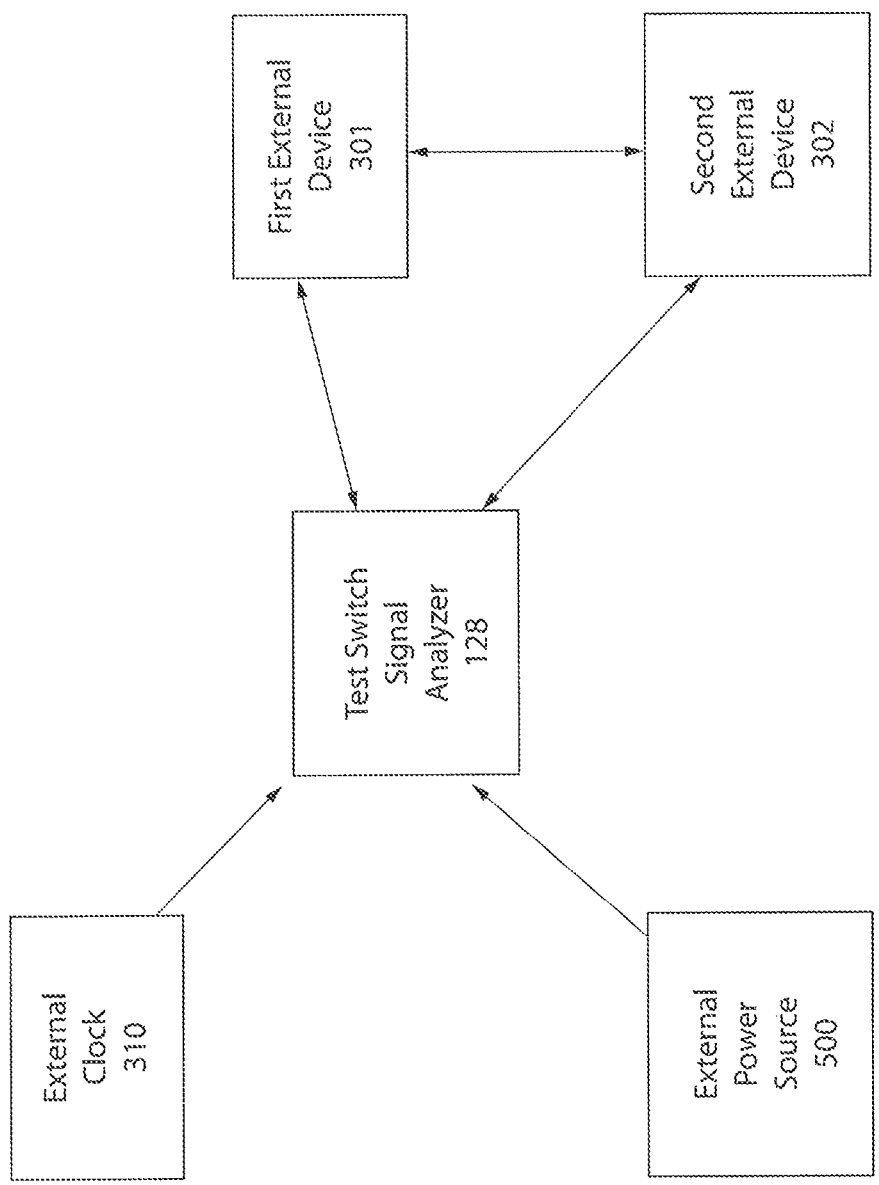
FIG. 8 is a block diagram showing a test switch signal analyzer communicating with external devices according to at least one embodiment of the invention.

FIG. 8 is a block diagram showing a test switch signal analyzer 128 exchanges data with external devices, such as first external device 301, second external device 302, external clock 310 and external power source 500.

In some embodiments, test switch signal analyzer 128 transmits sampled signal values and/or derived signal values to at least one of the external devices 301 and 302 via communication circuit 166 (shown in FIG. 7). In one embodiment, the first external device 301 is a central server and second external device 302 includes another test switch signal analyzer 128 that transmits electrical signal data (e.g., sampled signal values and derived signal values) to the central server. In these embodiments, the central server is configured to generate derived signal values based on the electrical signal data (e.g., sampled signal values and/or derived signal values) from test switch signal analyzer 128 and based on the electrical signal data (e.g., sampled signal values and/or derived signal values) transmitted from second external device 302.

In some embodiments, test switch signal analyzer 128 receives sampled signal values and/or derived signal values from an external device (e.g., external device 301 or 302) via communication circuit 166 (shown in FIG. 7). In these embodiments, processor 200 (shown in FIG. 7) of test switch signal analyzer 128 generates derived signal values based on the sampled signal values previously sampled by processor 200 and based on sampled signal values and/or derived signal values from an external device (e.g., external device 301 or 302).

In one embodiment, test switch signal analyzer 128 receives power from an external power source 500. Examples of power source 500 include: an external battery bank, an outlet connection to an electrical power grid.

In some embodiments, test switch analyzer 128 is time synchronized with other external devices (e.g., first external device 301 and second external device 302). In some embodiments, clock 165 of test switch signal analyzer 128 (shown in FIG. 7) is synchronized with a plurality of other devices using an external clock signal from external clock 310. In one embodiment, the external clock signal is synchronized to Coordinated Universal Time. In one embodiment, synchronization to an external clock signal includes an associated offset (e.g., for daylight savings time). Time synchronization improves data analysis by ensuring that data values measured at the same time by different components (e.g., test switch analyzer 128) are being compared.

Test switch signal analyzer 128 synchronizes clock 165 with a plurality of other devices by exchanging time information with a master device that includes a reference time. In one embodiment, a slave device (e.g., test switch signal analyzer 128) synchronizes its internal clock with the internal clock of a master device by receiving an internal clock time (i.e., reference time) from the master device and setting its internal clock to the internal clock time of the master device.

However, even after the synchronization, there is still a difference between the internal clock of the slave device and master device due to network propagation delay from transmitting the internal clock time to the slave device over a network. To compensate for network propagation delay, a slave device exchanges multiple data packets containing time information with master device and measure the round-trip propagation delay (i.e., the amount of time needed to transmit a request packet and receive a response packet). Master device or slave device calculates the network propagation delay based on the round-trip propagation delay and the slave device adjusts its internal clock based on the network propagation delay.

In wired networks, the network propagation delay is substantially equal to half of the round-trip propagation delay because the network propagation delay is substantially symmetrical. The delay of a packet sent from the master device to the slave device is generally the same as the delay of a packet sent from the slave device to the master device. Under these conditions, the master or slave device can discover and compensate for the network propagation delay by measuring the time between when a request data packet is transmitted and when a response data packet is received and dividing by two. The slave device can then adjust its internal clock by this network propagation delay to match the internal time of the master device.

Implementing the above time-synchronization methodology in wireless networks does not yield as accurate results as compared to wired networks because the network propagation delay is variable and not substantially symmetrical. In systems where there is variability in network propagation delay (e.g., wireless devices), a different methodology is preferred. Synchronizing devices in a wireless network and compensating for the variable network propagation delay is achieved in one embodiment illustrated by FIG. 9.

Figure 9:
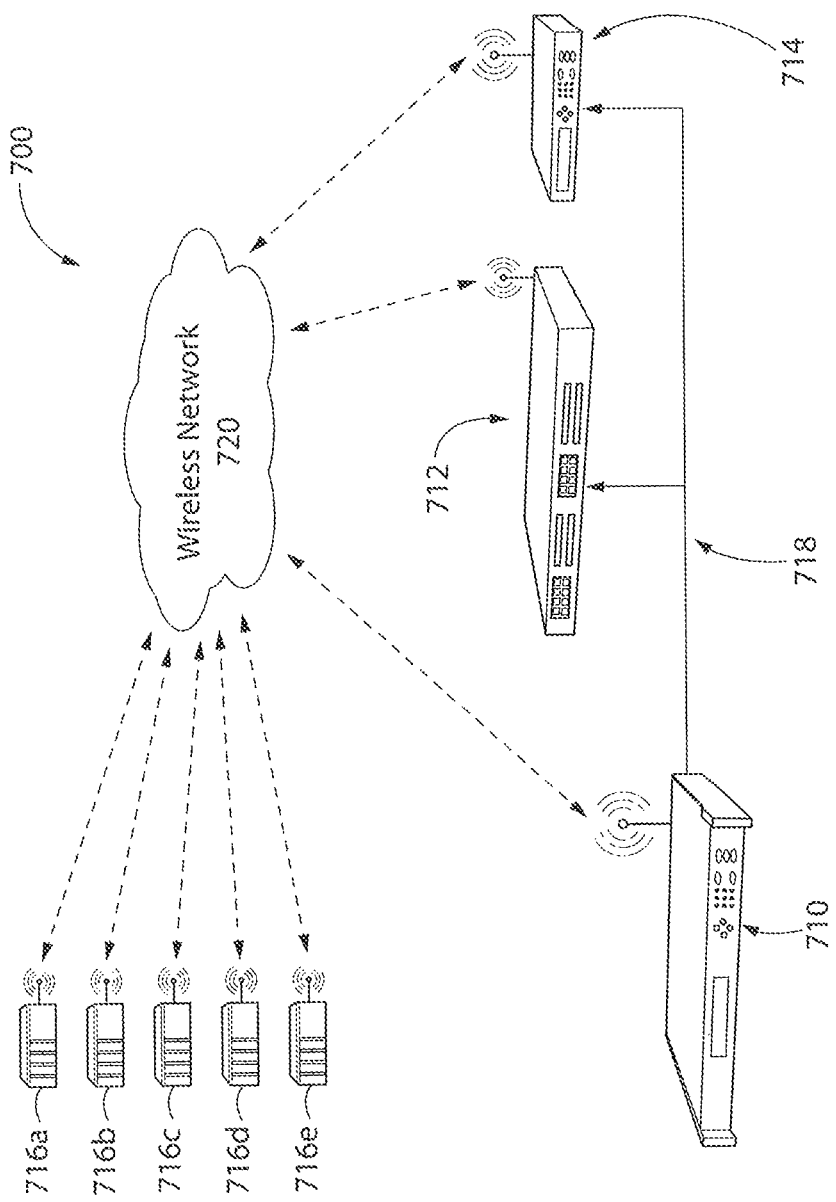
FIG. 9 is a schematic diagram of a system for synchronizing a plurality of devices, such as test switch analyzer, connected via a wireless network to other components of system according to at least one embodiment of the invention.

FIG. 9 is a schematic diagram of a system 700 for synchronizing a plurality of devices (e.g., test switch analyzer 128) connected via a wireless network to other components of system 700 according to at least one embodiment of the invention. In this embodiment, system 700 includes grandmaster clock 710, switch 712 (e.g., Ethernet switch), secondary clock 714 (e.g., clock offset differential annunciator) and a plurality of devices 716a-e. Grandmaster clock 710 is communicatively couplable to switch 712 and secondary clock 714 via wired network 718 and wireless network 720. In addition, grandmaster clock 710, switch 712 and secondary clock 714 are communicatively couplable to devices 716a-e via wireless network 720. Each of the components of system 700 includes an internal clock, a wireless communication module (e.g., antennas), a wired communication module (e.g., Ethernet), a microprocessor and memory. In this embodiment, system 700 synchronizes the plurality of devices 716a-e over a wireless network using the method explained below.

Figure 10:
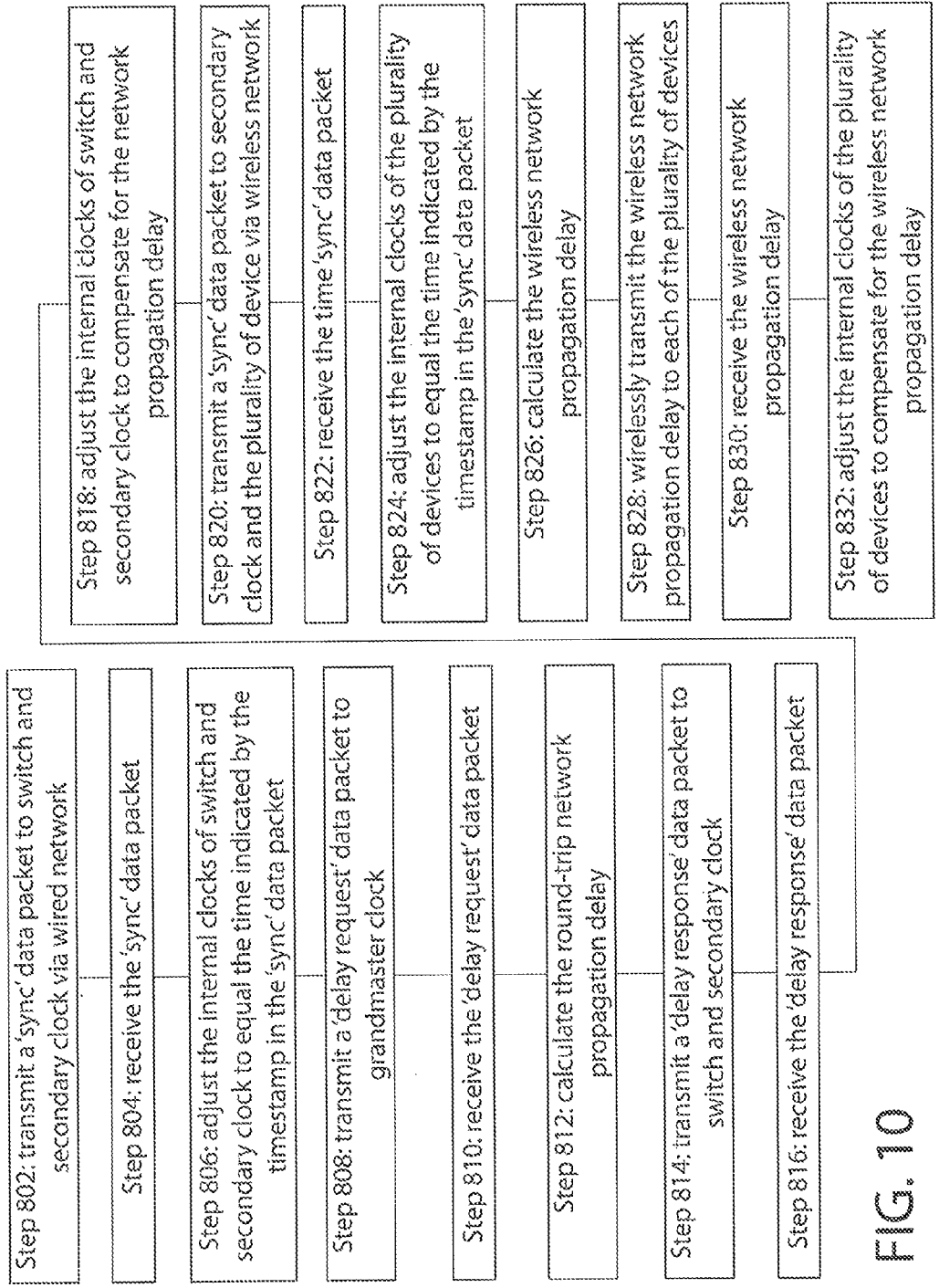
FIG. 10 illustrates a method for synchronizing a plurality of devices, connected via a wireless network to other components of a system according to at least one embodiment of the invention.

FIG. 10 illustrates a method 800 for synchronizing a plurality of devices 716a-e, connected via a wireless network to other components of system 700 according to at least one embodiment of the invention.

FIG. 10 illustrates steps 802-806, in which grandmaster clock 710 reduces the time synchronization error between its internal clock and the internal clock of switch 712 and the internal clock of secondary clock 714 to the wired network propagation delay. At step 802, grandmaster clock 710 transmits a sync data packet or message to switch 712 and secondary clock 714 via wired network 718. The sync data packet contains a timestamp indicating the time when the message was sent by grandmaster clock 710 according to the internal clock of grandmaster clock 710. At step 804, switch 712 and secondary clock 714 receive the sync data packet from grandmaster clock 710. At step 806, switch 712 and secondary clock 714 adjust the internal clocks of switch 712 and secondary clock 714 to equal the time indicated by the timestamp in the sync data packet. In one embodiment, to adjust the internal clocks, switch 712 and secondary clock 714 each calculate the time difference between the time the sync data packet was received and the time indicated by the timestamp in the sync data packet (i.e., the time at which grandmaster clock 710 transmitted the sync data packet). After calculating the time difference, switch 712 subtracts the time difference from the internal clock of switch 712. Secondary clock 714 also subtracts the time difference from the internal clock of secondary clock 714. After this adjustment, there may still be a difference between the internal clocks of switch 712 and secondary clock 714 as compared to grandmaster clock 710. The difference equal to the amount of time necessary for a data packet to travel from grandmaster clock 710 to switch 712 and secondary clock 714, is referred to herein as wired network propagation delay.

As explained above, at least in one embodiment, a device first calculates a round-trip wired network propagation delay in order to calculate and compensate for the wired network propagation delay. Steps 808-812 describe how grandmaster clock 710 calculates the round-trip wired network propagation delay. The round-trip wired network propagation delay is later used to calculate the wired network propagation delay. At step 808, switch 712 and secondary clock 714 transmit a delay request data packet to grandmaster clock 710. The delay request data packet contains a timestamp indicating the time in which the delay request data packet was transmitted by switch 712 and secondary clock 714 according to the internal clocks of switch 712 and secondary clock 714. At step 810, grandmaster clock 710 receives the delay request data packet from switch 712 and secondary clock 714. At step 812, grandmaster clock 710 calculates the round-trip wired network propagation delay. In one embodiment, grandmaster clock 710 calculates the round-trip wired network propagation delay by calculating the time difference between the time at which the sync data packet was transmitted from grandmaster clock 710 and the time at which the delay request packet is received by grandmaster clock 710. The time difference represents the round-trip wired network propagation delay.

FIG. 10 illustrates steps 814-818, in which switch 712 and secondary clock 714 adjust their internal clocks to compensate for the wired network propagation delay. At step 814, grandmaster clock 710 transmits a delay response data packet to switch 712 and secondary clock 714. The delay response data packet contains the round-trip propagation delay time calculated by the grandmaster clock 710. At step 816, switch 712 and secondary clock 714 receive the delay response data packet. At step 818, switch 712 and secondary clock 714 adjust their internal clocks based on the wired network propagation delay to compensate for the wired network propagation delay. In one embodiment, switch 712 and secondary clock 714 adjust their internal clocks by adding one-half of the round-trip propagation delay to each internal clock time. With this adjustment, switch 712 and secondary clock 714 are time synchronized with grandmaster clock 710.

FIG. 10 illustrates steps 820-826, in which the plurality of devices 716a-e adjust their internal clocks to correspond to the internal clock of switch 712 and secondary clock 714 calculates the wireless network propagation delay. At step 820, switch 712 wirelessly transmits a sync data packet to secondary clock 714 and the plurality of device 716a-e via wireless network 720. This sync data packet contains a timestamp indicating the time in which the packet was transmitted by switch 712 according to the internal clock of switch 712. At step 822, secondary clock 714 and the plurality of device 716a-e receive the time sync data packet from switch 712 at substantially the same time. At step 824, the plurality of devices 716a-e adjust their internal clock times to equal the time indicated by the timestamp in the sync data packet from switch 712. In one embodiment, to adjust their internal clocks, each of the plurality of devices 716a-e calculates a time difference between its internal clock and the time indicated by the timestamp in the sync data packet from switch 712 and subtracts the time difference from the internal clock time of each of the plurality of devices 716a-e. However, even after the plurality of devices 716a-e adjust their internal clocks, there will still be a time difference between the internal clock of the plurality of devices 716a-e and the internal clock of switch 712. This time difference will be equal to the amount of time it took for the sync data packet to propagate from switch 712 to the plurality of devices 716a-e over the wireless network 720 (i.e., wireless network propagation delay). At step 826, secondary clock 714 calculates the wireless network propagation delay. Because secondary clock 714 and switch 712 are both synchronized to grandmaster clock 710, and to each other, secondary clock 714 calculates the wireless network propagation delay by calculating the time difference between the time of the internal clock of secondary clock 714 when secondary clock 714 receives the sync data packet from switch 712 and the time indicated by the timestamp in the sync data packet from switch 712 (i.e., the amount of time to transmit a data packet from switch 712 to secondary clock 714). The time difference represents the wireless network propagation delay.

FIG. 10 illustrates steps 828-832, in which each of the plurality of devices 716a-e adjust their internal clocks to compensate for wireless network propagation delay and synchronize with grandmaster clock 710. At step 828, secondary clock 714 wirelessly transmits the wireless network propagation delay to each of the plurality of devices 716a-e. At step 830, each of the plurality of devices 716a-e receives the wireless network propagation delay. At step 832, each of the plurality of devices 716a-e adjusts their internal clocks based on the wireless network propagation delay to compensate for the wireless network propagation delay. In one embodiment, each of the plurality of devices 716a-e adjusts their internal clocks by adding the wireless propagation delay received from secondary clock 714 to each internal clock of the plurality of devices 716a-e. With this adjustment, the plurality of devices 716a-e are time synchronized with grandmaster clock 710, and each other.

The exemplary method described above can be repeated at regular time intervals to ensure the clocks remain synchronized within acceptable limits. In one embodiment, this synchronization process is performed once each second.

In an alternative embodiment, switch 712 and secondary clock 714 are integrated as one device (i.e., an intermediate clock). In this embodiment, at step 820, grandmaster clock 710 wirelessly transmits a sync data packet to the intermediate clock and the plurality of device 716a-e via wireless network 720. At step 822, intermediate clock and the plurality of device 716a-e receive the time sync data packet from grandmaster clock 710 at substantially the same time. At step 824, the plurality of devices 716a-e adjusts their internal clock times to equal the time indicated by the timestamp in the sync data packet from grandmaster clock 710. At step 826, intermediate clock calculates the wireless network propagation delay. At step 828, intermediate clock wirelessly transmits the wireless network propagation delay to each of the plurality of devices 716a-e. At step 830, each of the plurality of devices 716a-e receives the wireless network propagation delay. At step 832, each of the plurality of devices 716a-e adjusts their internal clocks based on the wireless network propagation delay to compensate for the wireless network propagation delay. As a result of integrating switch 712 and secondary clock 714, the number of different components communicating over the wired and wireless networks can be reduced, thereby reducing the amount of data propagating over the wired and wireless networks.

Figure 11:
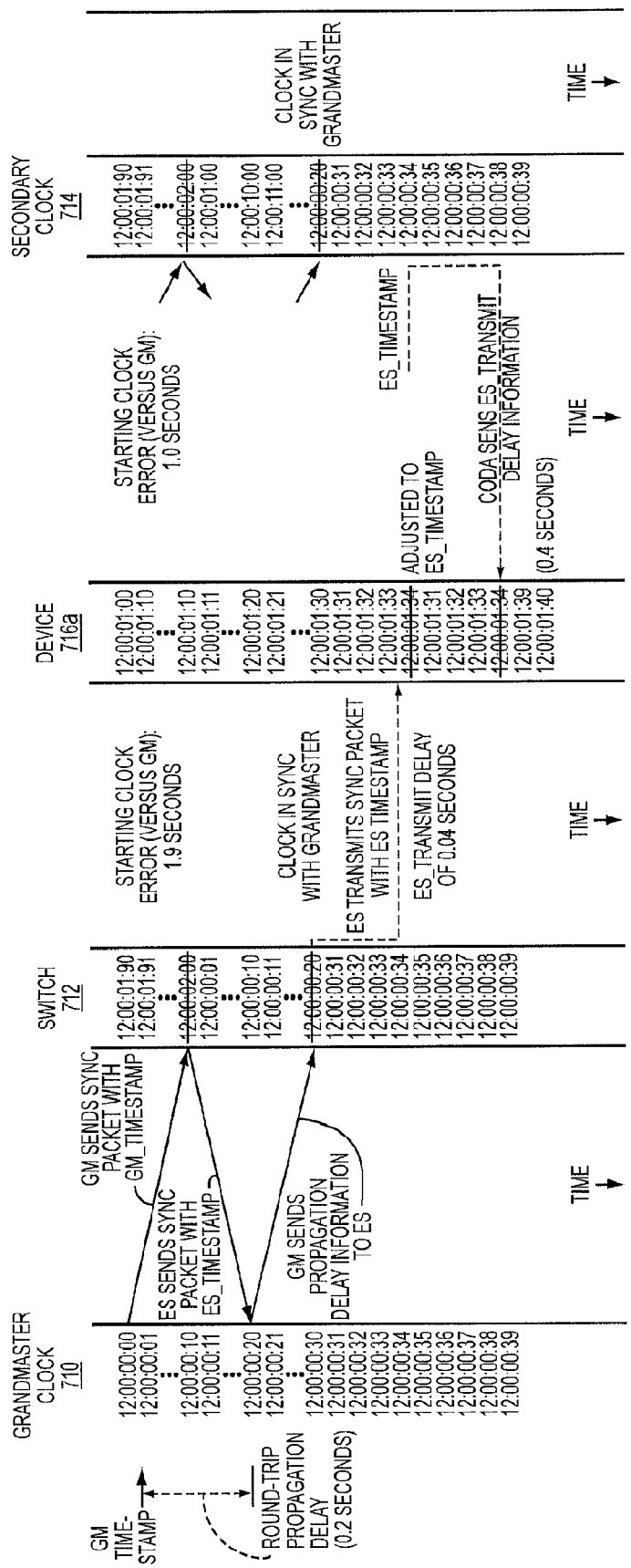
FIG. 11 illustrates a flow diagram illustrating the data exchanged between components of system and the internal clock adjustments for each of the components in system for synchronizing a plurality of devices in accordance with the method described in FIG. 10.

FIG. 11 is a flow diagram illustrating the data exchanged between components of system 700 and the internal clock adjustments for each of the components in system 700 for synchronizing a plurality of devices 716a-e in accordance with the method described in FIG. 10.

Initially, grandmaster clock 710 has an internal clock time of 12:00:00:00; switch 712 has an internal clock time of 12:00:01:90 (1.9 second error compared to grandmaster clock 710); device 716a has an internal clock time of 12:00:01 (1.0 second error compared to grandmaster clock 710); and secondary clock 714 has an internal clock time of 12:00:01:90 (1.9 second error compared to grandmaster clock 710). After receiving the sync data packet from grandmaster clock 710, switch 712 and secondary clock 714 each adjust their internal clocks to equal the time indicated by the timestamp in the sync data packet (i.e., 12:00:00:00—the time at which grandmaster clock 710 transmitted the sync data packet) and transmit a delay request data packet to grandmaster clock 710. After receiving the delay request data packet, grandmaster clock 710 calculates the round-trip network propagation delay (i.e., 0.2 seconds) and transmits the round-trip network propagation delay to switch 712 and secondary clock 714. Switch 712 and secondary clock 714 adjust their internal clocks based on the network propagation delay (i.e., adding 0.1 seconds—one half of the round-trip network propagation delay—to their internal clocks) to synchronize with grandmaster clock 710. After synchronizing with grandmaster clock 710, switch 712 wirelessly transmits a sync data packet to device 716a and secondary clock 714. Device 716a adjusts its internal clock to equal the time indicated by the timestamp in the sync data packet (i.e., 12:00:01:30—the time at which switch 712 transmitted the sync data packet) and secondary clock 714 calculates the wireless network propagation delay (i.e., 0.4 seconds). After receiving the wireless network propagation delay from secondary clock 714, device 716a adjusts its internal clocks to compensate for the wireless network propagation delay by adding the wireless propagation delay (i.e., 0.4 seconds) received from secondary clock 714 to its internal clock (i.e., 12:00:01:34). With this adjustment, device 716a is time synchronized (i.e., 12:00:01:38) with grandmaster clock 710.

Figure 12:
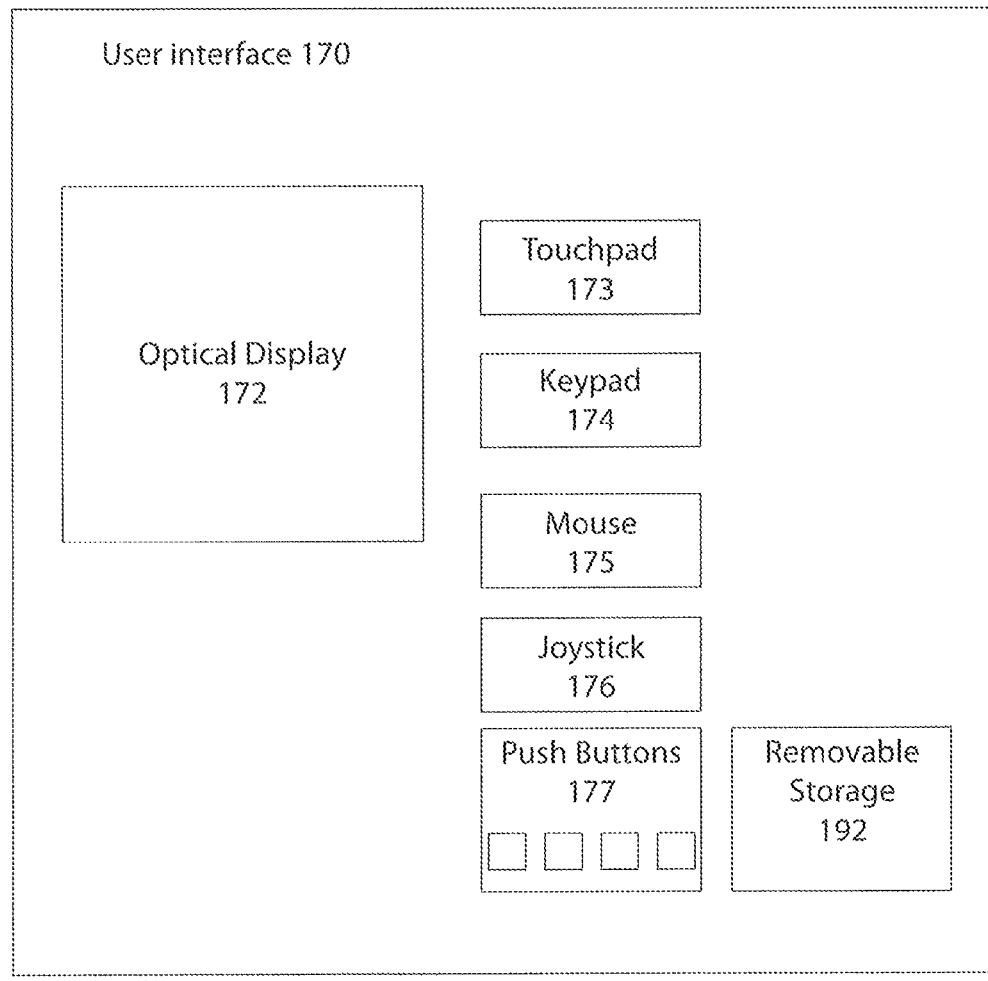
FIG. 12 is a block diagram of a user interface according to at least one embodiment of the invention.

FIG. 12 is a block diagram of user interface 170 according to at least one embodiment of the invention. In one embodiment, user interface 170 provides for user interaction in the form of at least one of an optical display 172, a touchpad 173, a keypad 174, a mouse 175, a joystick 176, and push buttons 177.

In one embodiment, optical display 172 shows the derived signal values as they are being measured, in real time. In one embodiment, optical display 172 shows the electrical signal data as they are being derived, in real time. In one embodiment, the optical display 172 displays sampled signal values (e.g., a voltage or current waveform) which include a time-based element which depicts how the voltage and current levels change over a time period. In one embodiment, the optical display 172 displays derived signal values or electrical signal records. In some embodiments, the optical display 172 displays the extent to which sampled signal values and/or the derived signal values differ from or exceed threshold values.

In one embodiment, the user interface 170 provides for user interaction in the form of at least one of an optical display 172, or user input (e.g., touchpad 173, keypad 174, mouse 175, joystick 176, and push-buttons 177). In one embodiment, the optical display 172 allows the user to selectively identify at least one of which electrical signals to show on the optical display 172, which electrical signals to save in storage medium 190 or removable storage 192, and identify which electrical signals to transmit to an external device 301 or 302. In one embodiment, the user interface 170 allows the user to set electrical signal threshold levels.

Figure 13A:
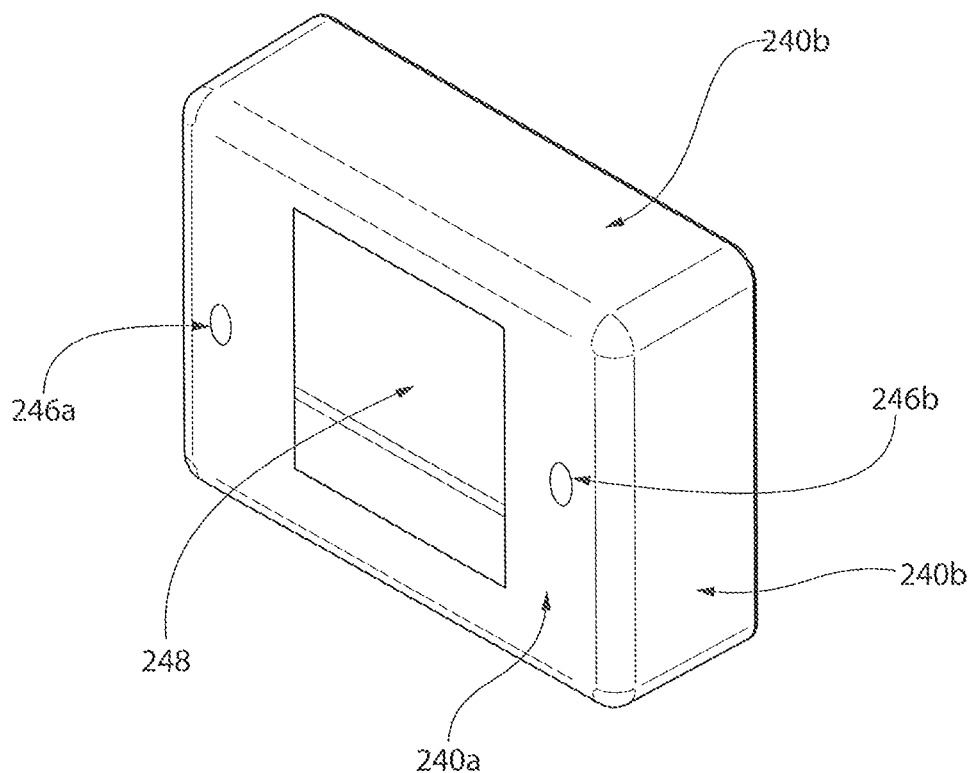
FIG. 13A shows an exemplary test switch cover according to at least one embodiment of the invention.
Figure 13B:
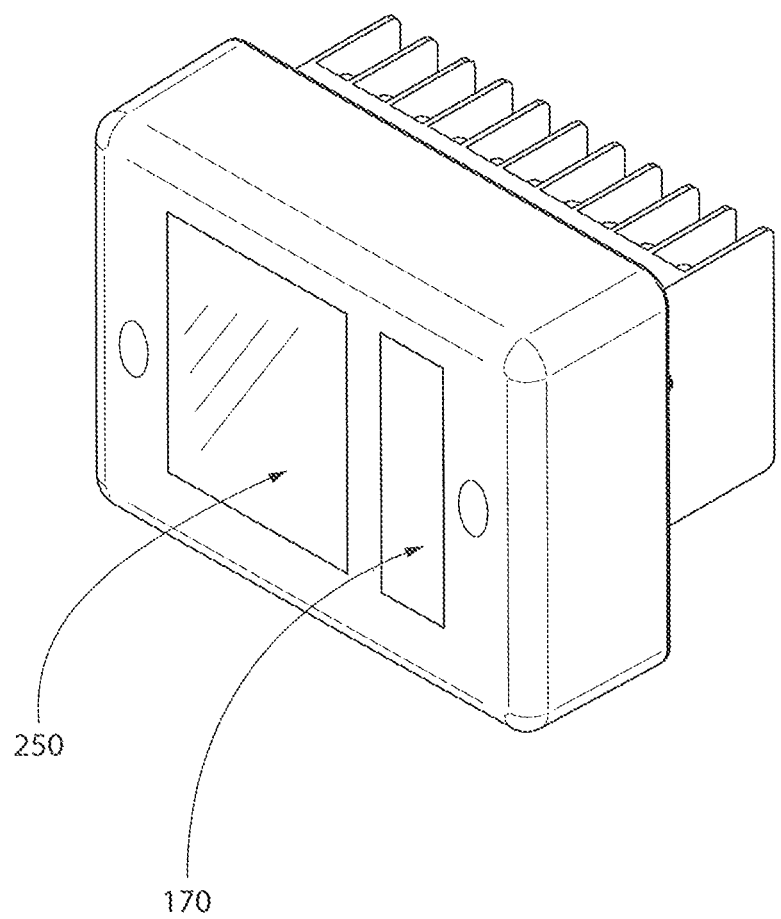
FIG. 13B shows an exemplary test switch cover according to at least one embodiment of the invention.

FIGS. 13A-13B show exemplary test switch covers 240 according to different embodiments of the invention. The test switch cover 240 protects test switch base 101. In one embodiment, test switch cover 240 includes a top wall 240a and side walls 240b extending from top wall 240a to form a housing or cavity. In one embodiment, test switch cover 240 includes a pair of holes 246a and 246b. In one embodiment, each hole 246a or 246b is located on opposite ends of the top wall 240a. The holes 246 are sized to receive at least a portion of mounting posts 400 extending from test switch base 101 (as shown in FIG. 1A) that attach test switch cover 240 to test switch base 101 via mounting components (e.g., knobs) coupled to mounting posts 400. In one embodiment, top wall 240a or side walls 240b of test switch cover 240 includes a cutout 248, as shown in FIG. 13A, or a translucent lens 250, as shown in FIG. 13B, such that, when test switch cover 240 is secured to test switch base 101, a portion of the signal processing unit 160 which contain an optical display 172 or a user interface 170 can be seen or touched from a point outside test switch cover 240. In one embodiment, test switch cover 240 contains a user interface 170 (as depicted in FIG. 12) which includes at least one of a touchpad 173, keypad 174, mouse 175, joystick 176 and push-buttons 177. In one embodiment, the user interface 170 allows the user to selectively identify at least one of which electrical signals to show on the optical display 172, which electrical signals to save in a storage medium 190, and which electrical signals to transmit to an external device 300. In one embodiment, the user interface 170 allows the user to set electrical signal threshold levels.

Figure 14A:
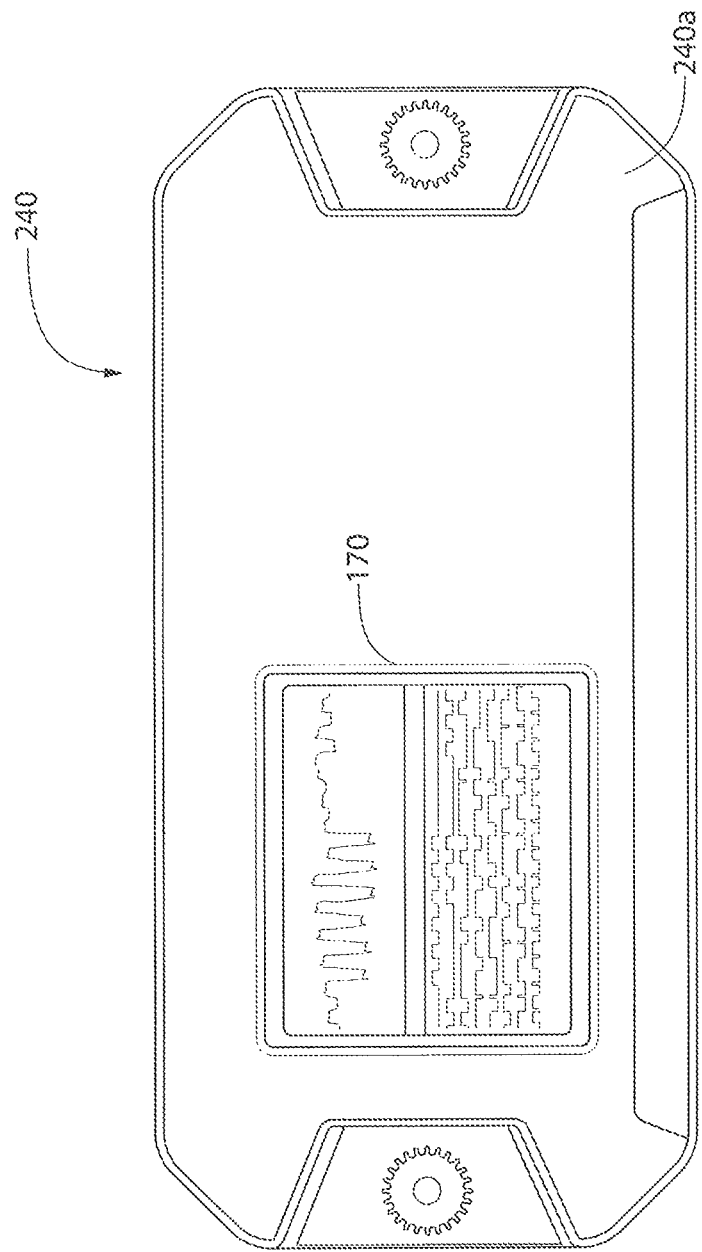
FIG. 14A depicts a plan view of an exemplary test switch cover having an exemplary graphical user interface according to at least one embodiment of the invention.
Figure 14B:
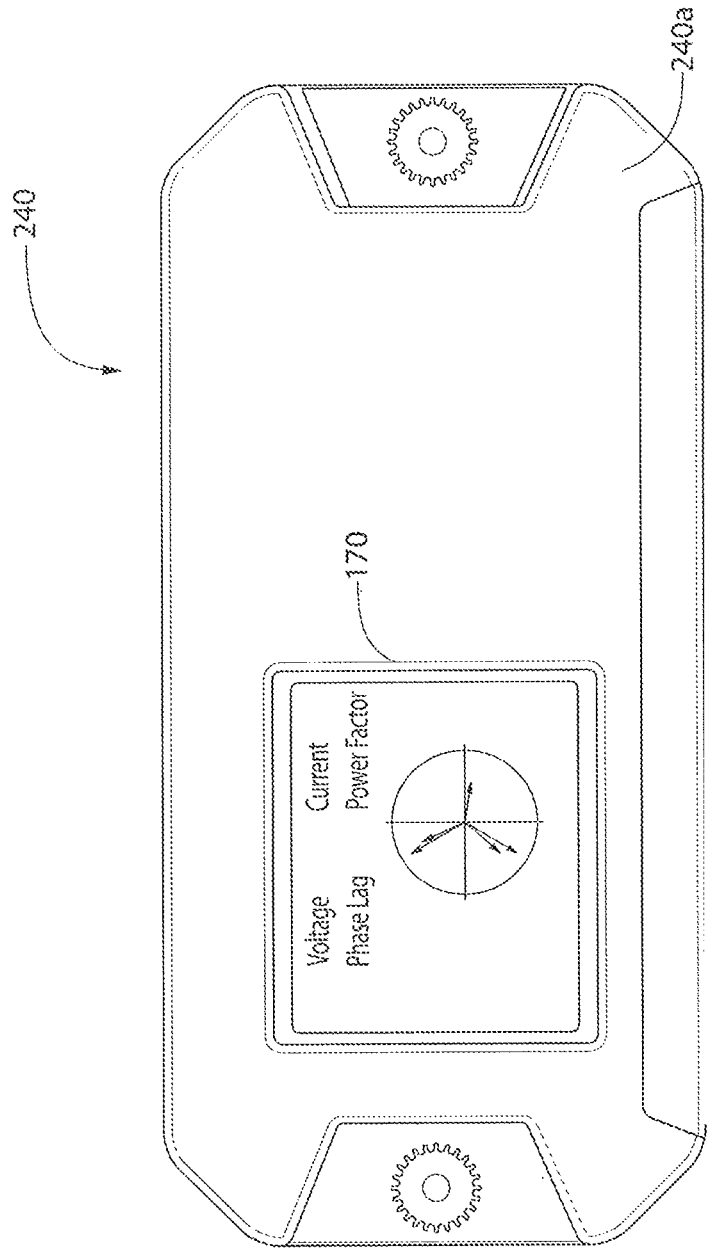
FIG. 14B depicts a plan view of an exemplary test switch cover having an exemplary graphical user interface according to at least one embodiment of the invention.

FIGS. 14A-14B each depict a top view of an exemplary test switch cover 240 and exemplary graphical user interfaces 170 of the exemplary test switch cover 240 according to different embodiments of the invention. In FIG. 14A, graphical user interface 170 is configured to show various test switch signals (e.g., voltages and currents) on a common time axis. This type of display aids a user with analyzing a chronology of events for electrical signals propagating through each of the test switch conductors. In FIG. 14B, graphical user interface 170 shows a phasor diagram illustrating three phases of voltage and current signals, allowing the user to analyze (on a polar diagram) time delays (in degrees) between various signals.

Figure 14C:
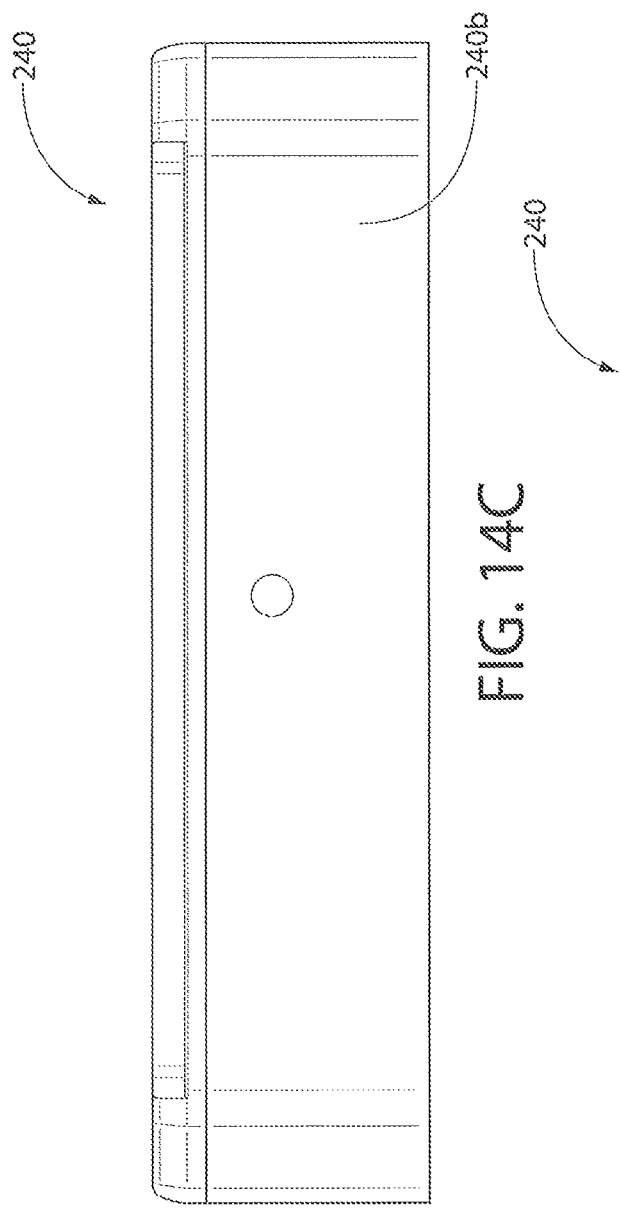
FIG. 14C depicts a first side view of the exemplary test switch cover of FIG. 14A.
Figure 14D:
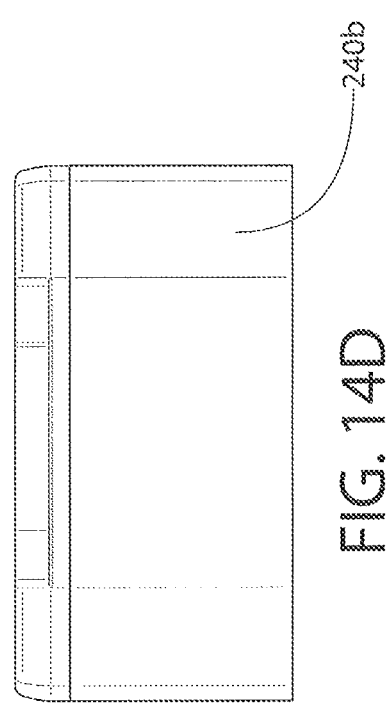
FIG. 14D depicts a second side view of the exemplary test switch cover of FIG. 14A.
Figure 14E:
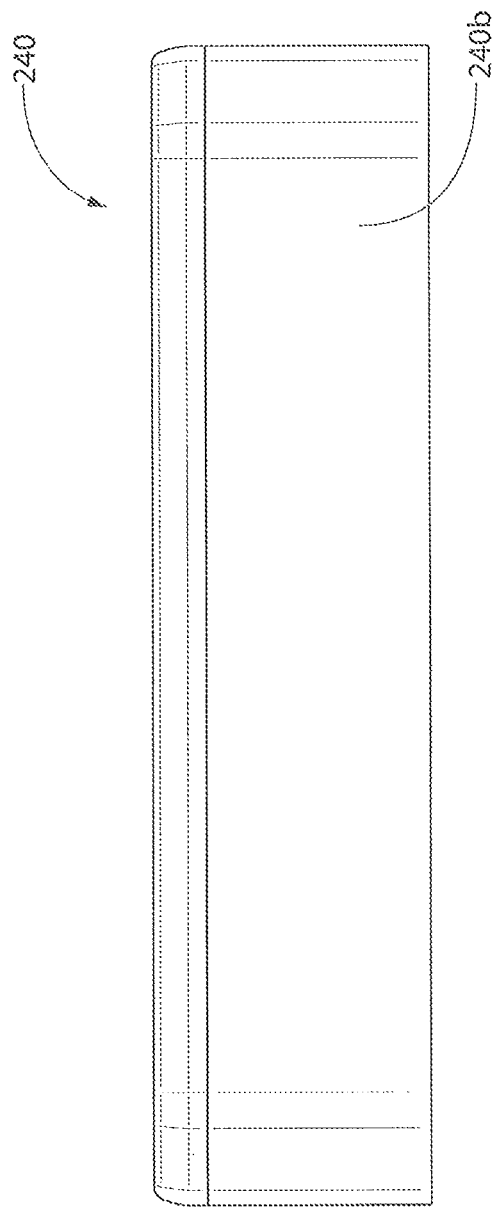
FIG. 14E depicts a third side view of the exemplary test switch cover of FIG. 14A.
Figure 14F:
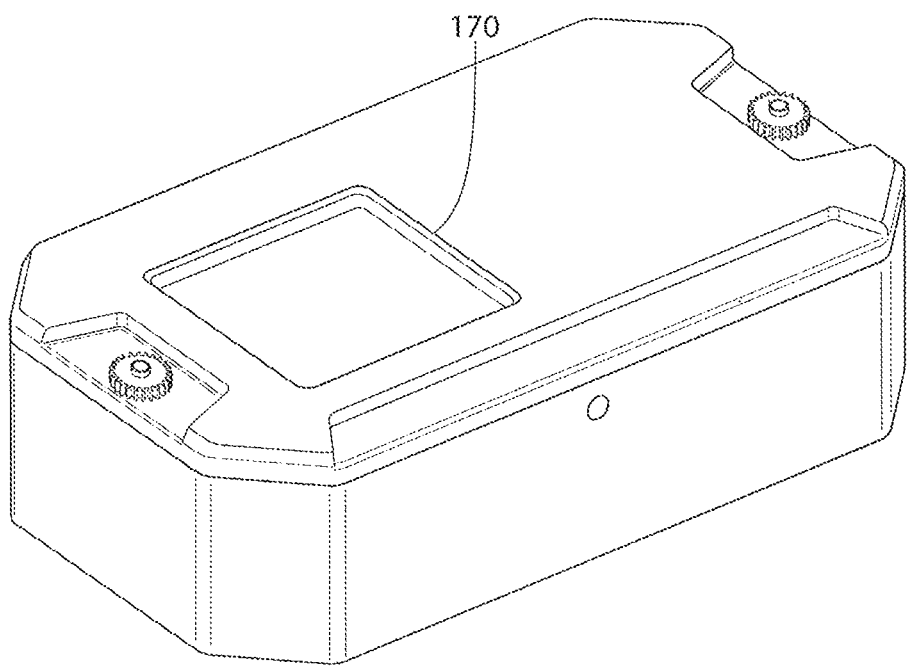
FIG. 14F depicts an isometric view of the exemplary test switch cover of FIG. 14A.

FIG. 14A depicts a plan view of an exemplary test switch cover having an exemplary graphical user interface according to at least one embodiment of the invention; FIG. 14B depicts a plan view of an exemplary test switch cover having an exemplary graphical user interface according to at least one embodiment of the invention; FIG. 14C depicts a first side view of the exemplary test switch cover of FIG. 14A. FIG. 14D depicts a second side view of the exemplary test switch cover of FIG. 14A; FIG. 14E depicts a third side view of the exemplary test switch cover of FIG. 14A; FIG. 14F depicts an isometric view of the exemplary test switch cover of FIG. 14A.

Figure 15:
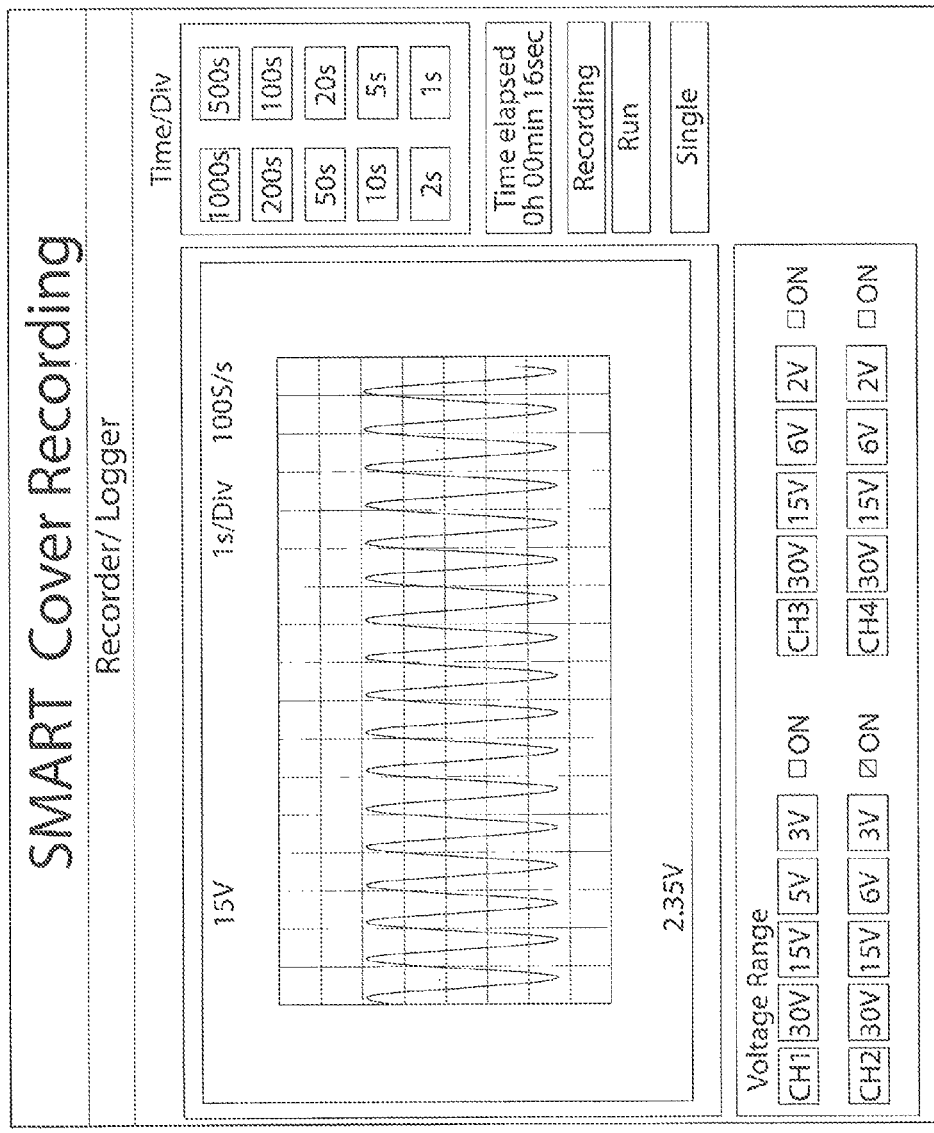
FIG. 15 shows an exemplary graphical user interface according to at least one embodiment of the invention.

FIG. 15 depicts an exemplary graphical user interface 170 according to at least one embodiment of the invention. In this embodiment, graphical user interface 170 shows a test switch signal (e.g., voltage) on a common time axis.

The following disclosure relates to assembling and installing a test switch signal analyzer 128 according to at least one embodiment of the invention. In one embodiment, a test switch signal analyzer (e.g., test switch signal analyzer 128) is installed in a test switch by performing at least one of: coupling a signal probe (e.g., voltage probe 130) to a first selectable position (e.g., at one of the plurality of coupling components 142 or 144) of an analyzer hub (e.g., analyzer hub 140) such that the signal probe is positioned on the analyzer hub to correspond to a feature of a test switch conductor (e.g., test switch conductor 102); attaching the analyzer hub to the test switch base (e.g., test switch base 101) to complete an electrical connection between the at least one signal probe and the test switch conductor; and attaching the test switch cover (e.g., test switch cover 240) to the test switch base.

In a further embodiment, the test switch signal analyzer can be installed in a test switch by performing at least one of: mounting the test switch cover to the front or rear of the test switch base.

In a further embodiment, the test switch analyzer can be installed by decoupling the signal probe from a first selectable location; and coupling the signal probe to a second selectable location.

In a further embodiment, if the signal probe is a two-sided slotted probe (e.g., two-sided slotted probe 155), the method to install the two-sided slotted probe includes: slideably coupling the two-sided slotted probe to a first portion of the test switch conductor and slideably coupling an insulator to a second portion of the test switch conductor to prevent an electrical coupling between a non-shorting blade (e.g., non-shorting blade 103) of the test switch conductor and a terminal (e.g., terminal 120a or 120b) of the test switch base.

In a further embodiment, a test switch analyzer can be installed in a test switch by performing at least one of: coupling a first end of a signal probe to an analyzer hub at a first selectable location (e.g., at one of the plurality of coupling components 142 or 144); decoupling the at least one signal probe from a first selectable location; coupling the at least one signal probe to a second selectable location (e.g., at another of the plurality of coupling components 142 or 144); completing an electrical connection between the analyzer hub and the test switch conductor by coupling a second end of the signal probe to the test switch conductor; attaching the analyzer hub to the test switch base; and attaching the test switch cover to the test switch base.

In a further embodiment, a test switch analyzer can be installed in a test switch by performing at least one of: mounting the test switch cover to the front or rear of the test switch base.

In one embodiment, a test switch signal analyzer (e.g., test switch signal analyzer 128) is assembled by performing at least one of: providing an analyzer hub (e.g., analyzer hub 140), the analyzer hub including (i) a signal processing unit (e.g., signal processing unit 160) configured to process electrical signal characteristics on a test switch conductor (e.g., test switch conductor 102) received from at least one signal probe (e.g., voltage probe 130), (ii) first and second groups of apertures (e.g., a first plurality of coupling components 142 or 144 and a second plurality of coupling components 142 or 144) of a printed circuit board, each contact aperture configured to receive a signal probe; and coupling each signal probe to at least one of the apertures of the printed circuit board, each signal probe being positioned to correspond to a test switch conductor when the analyzer hub is secured to the test switch base.

In a further embodiment, the first group of apertures are aligned in a row.

In a further embodiment, the first group of apertures receives a voltage signal probe (e.g., voltage signal probe 130) or a current signal probe (e.g., current signal probe 150).

In a further embodiment, the test switch signal analyzer is assembled by further performing the step of: positioning a current probe in at least one aperture of the second group of apertures.

In a further embodiment, the test switch analyzer is assembled by further performing the step of: coupling the analyzer hub to the test switch base.

In at least one embodiment, there is included one or more computers having one or more processors and memory (e.g., one or more nonvolatile storage devices). In some embodiments, memory or computer readable storage medium of memory stores programs, modules and data structures, or a subset thereof for a processor to control and run the various systems and methods disclosed herein. In one embodiment, a non-transitory computer readable storage medium having stored thereon computer-executable instructions which, when executed by a processor, perform one or more of the methods disclosed herein.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and features of the disclosed embodiments may be combined. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

We claim:

1. A test switch signal analyzer comprising:
    an analyzer hub operably couplable to a test switch base that includes a plurality of test switch conductors;
    at least one signal probe operatively couplable to the analyzer hub and to at least one of the plurality of test switch conductors when the analyzer hub is coupled to the test switch base, each of the at least one signal probes being configured to receive electrical signals from one of the plurality of test switch conductors and to generate one or more probe signals that corresponds to the received electrical signals;
    a signal processing unit coupled to the analyzer hub and configured to receive the one or more probe signals from the at least one signal probe, the signal processing unit configured to determine a plurality of electrical signal values based on the probe signals received from the at least one signal probe;
    the signal processing unit, the analyzer hub, and at least a portion of the at least one signal probe being positionable within a test switch cover configured and dimensioned to mate with the test switch base when the at least one signal probe is coupled to the at least one of the plurality of test switch conductors and the test switch cover is secured to the test switch base;
    wherein the signal processing unit is configured to sample each of the one or more probe signals and configured to generate a plurality of sampled signal values, and
    wherein the at least one signal probe includes a voltage probe and the electrical signals include a voltage signal.

2. The test switch signal analyzer of claim 1, wherein the test switch cover and the test switch base enclose the test switch signal analyzer when the test switch cover is removably secured to the test switch base.

3. The test switch signal analyzer of claim 1, wherein at least one of: the signal processing unit, the analyzer hub and the at least one signal probe is integral to the test switch cover.

4. The test switch signal analyzer of claim 1, wherein the signal processing unit is integral to the analyzer hub.

5. The test switch signal analyzer of claim 1, wherein the test switch cover includes a perimeter engagement surface configured and dimensioned such that substantially all of the perimeter engagement surface contacts the test switch base when the test switch cover is secured to the test switch base.

6. The test switch signal analyzer of claim 1, wherein the test switch cover is configured and dimensioned to mate with and mount to a front of the test switch base and to a rear of the test switch base.

7. The test switch signal analyzer of claim 1, wherein the analyzer hub is at least one of: a panel, a circuit board, a portion of a circuit board, a connector, and a mesh of wires.

8. The test switch signal analyzer of claim 1, wherein the at least one signal probe includes a current probe and the electrical signal includes a current signal.

9. The test switch signal analyzer of claim 8, wherein the current probe includes a Rogowski coil.

10. The test switch signal analyzer of claim 8, wherein the current probe includes a slotted probe.

11. The test switch signal analyzer of claim 10, wherein the slotted probe is configured to slideably straddle one of the plurality of test switch conductors when the one of the plurality of test switch conductors is in a closed position such that the slotted probe is electrically coupled to one of the plurality of test switch conductors.

12. The test switch signal analyzer of claim 11, wherein the slotted probe has a slotted first electrically conducting face and a slotted second electrically conducting face that is spaced apart from the slotted first electrically conducting face to align with and couple to current-carrying springs on two sides of a non-shorting knife blade of one of the plurality of test switch conductors when the non-shorting blade is in the closed position.

13. The test switch signal analyzer of claim 12, wherein the first electrically conducting face is electrically couplable to a first current spring contact of the test switch base and the second electrically conducting face is electrically couplable to a second current spring contact of the test switch base when the non-shorting blade is in the closed position to make an electrical connection between a first terminal and a second terminal of the test switch base.

14. The test switch signal analyzer of claim 12, wherein the slotted probe includes an insulator disposed between the first electrically conducting face and the second electrically conducting face.

15. The test switch signal analyzer of claim 14, wherein the slotted probe includes a first lead and a second lead, the first lead electrically coupled to the first electrically conducting face and to the analyzer hub, the second lead electrically coupled to the second electrically conducting face and to the analyzer hub.

16. The test switch signal analyzer of claim 9, wherein the Rogowski coil includes a distal end that is configured and dimensioned to wrap around one of the plurality of test switch conductors when the one of the plurality of test switch conductors is carrying a current, the test switch cover is secured to the test switch base and a proximal end of the Rogowski coil is operably coupled to the analyzer hub.

17. The test switch signal analyzer of claim 1, wherein the voltage probe includes an input portion couplable to the analyzer hub and a contact portion that is configured to contact a non-insulated portion of the one of the plurality of test switch conductors when the one of the plurality of test switch conductors is carrying a voltage, the test switch cover is secured to the test switch base and the input portion is operably coupled to the analyzer hub.

18. The test switch signal analyzer of claim 17, wherein the contact portion includes a spring-loaded contact.

19. The test switch signal analyzer of claim 1, wherein the at least one signal probe includes a plurality of voltage probes, each of the plurality of voltage probes comprising a spring-loaded contact positionable on the analyzer hub such that when the analyzer hub and the test switch cover are coupled to the test switch base, each of the plurality of voltage probes contacts a non-insulated portion of one of the plurality of test switch conductors.

20. The test switch signal analyzer of claim 1, wherein the signal processing unit is configured to determine at least one derived signal value from a plurality of sampled signal values sampled from the one or more probe signals, the at least one derived signal value being representative of at least one of: voltage, RMS voltage, frequency of voltage, voltage waveforms, current, RMS current, frequency of current, current waveforms, time, harmonics, offset, phasor, phasor measurement unit, phasor amplitude, phasor phase, phasor waveforms, position in a cycle, rate of change of any of the one or more probe signals.

21. The test switch signal analyzer of claim 20, wherein the signal processing unit is configured to store, in a storage medium, at least one of: the plurality of sampled signal values and the at least one derived signal value.

22. The test switch signal analyzer of claim 20, wherein the signal processing unit includes a computer readable medium having data, instructions or a combination thereof for generating and storing at least one electrical signal record based on the plurality of sampled signal values or the at least one derived signal value.

23. The test switch signal analyzer of claim 1, wherein the signal processing unit is configured to determine at least one derived signal value from a plurality of sampled signal values sampled from two or more of the one or more probe signals, the at least one derived signal value being representative of at least one of: voltage, RMS voltage, frequency of voltage, voltage waveforms, current, RMS current, frequency of current, current waveforms, power, average power, real power, reactive power, power waveforms, resistance, impedance, conductance, time, harmonics, offset, phase, phasor, phasor measurement unit, phasor amplitude, phasor phase, phasor waveforms, position in a cycle, and rate of change of any of the electrical signals.

24. The test switch signal analyzer of claim 23, wherein the signal processing unit is configured to store, in a storage medium, at least one of: the plurality of sampled signal values and the at least one derived signal value.

25. The test switch signal analyzer of claim 24, wherein the signal processing unit includes a computer readable medium having data, instructions or a combination thereof for generating and storing at least one electrical signal record based on the plurality of sampled signal values or the derived signal values.

26. The test switch signal analyzer of claim 22, wherein the signal processing unit includes a transmitter configured to transmit the at least one electrical signal record, the at least one derived signal value or the plurality of sampled signal values to an external device external to the test switch cover.

27. The test switch signal analyzer of claim 26, wherein the signal processing unit is configured to transmit the at least one electrical signal record, the at least one derived signal value or the plurality of sampled signal values to the external device when at least one of the plurality of sampled signal values exceeds a predetermined threshold value.

28. The test switch signal analyzer of claim 26, wherein the signal processing unit is configured to transmit the at least one electrical signal record, the at least one derived signal value or the plurality of sampled signal values to the external device when the at least one derived signal value exceeds a predetermined threshold value.

29. The test switch signal analyzer of claim 1, wherein the signal processing unit is configured to:
  determine a first derived signal value from a first plurality of sampled signal values associated with the one or more probe signals and sampled at a first time-based sampling interval,
  determine a second derived signal value from a second plurality of sampled signal values associated with the one or more probe signals and sampled at a second time-based sampling interval,
  compare the first derived signal value to a threshold value, and
  transmit the second derived signal value and the second plurality of sampled signal values to an external device if the first derived signal value exceeds the threshold value.

30. The test switch signal analyzer of claim 29, wherein the first time-based sampling interval and the second time-based sampling interval are user-selected.

31. The test switch signal analyzer of claim 29, wherein the signal processing unit includes a receiver configured to:
  receive a request from the external device for the second plurality of sampled signal values, and
  transmit the second plurality of sampled signal values in response to the request from the external device.

32. The test switch signal analyzer of claim 29, wherein the signal processing unit includes a receiver configured to:
  receive a request from the external device for the second derived signal value, and
  transmit the second derived signal value in response to the request from the external device.

33. The test switch signal analyzer of claim 12, wherein the slotted probe is configured to slideably straddle the non-shorting knife blade when the non-shorting knife blade is in the closed position such that the slotted probe is in electrical contact with the current-carrying springs on the two sides of the non-shorting knife blade.

34. The test switch signal analyzer of claim 12, wherein the slotted probe is positionable in an installed position in electrical contact with the current-carrying springs on first and second sides of the non-shorting knife blade of one of the plurality of test switch conductors, and wherein the slotted probe includes an insulator disposed over a portion of the non-shorting knife blade, the insulator configured to prevent electrical contact between the non-shorting blade and a terminal of the test switch base when the non-shorting knife blade is in the closed position.

35. The test switch signal analyzer of claim 1, wherein the at least one signal probe includes an RJ connector configured to releasably engage with the analyzer hub.

36. The test switch signal analyzer of claim 1, wherein the analyzer hub includes a printed circuit board that includes a plurality of signal probe coupling components, each signal probe coupling component being couplable to one of the at least one signal probes.

37. The test switch signal analyzer of claim 1, wherein the at least one signal probe is engageable with the analyzer hub in a plurality of selectable positions.

38. The test switch signal analyzer of claim 37, wherein the selectable positions align with one of the plurality of test switch conductors.

39. The test switch signal analyzer of claim 38, wherein the at least one signal probe includes a plurality of spring loaded contacts positioned on the analyzer hub in a first row that aligns with a first row of terminal contacts on the test switch base when the analyzer hub is coupled to the test switch base.

40. The test switch signal analyzer of claim 39, wherein the analyzer hub includes a second row of terminal contacts and the at least one signal probe includes at least one slotted probe positioned on the analyzer hub in a second row that aligns with the second row of terminal contacts when the analyzer hub is coupled to the test switch base.

41. The test switch signal analyzer of claim 39, wherein the at least one signal probe includes at least one Rogowski coil positioned on the analyzer hub to align with a terminal contact in a second row when the analyzer hub is coupled to the test switch base.

42. The test switch signal analyzer of claim 41, wherein the analyzer hub includes a plurality of contact apertures aligned with the first row of terminal contacts on the test switch base, the contact apertures configured to receive a probe.

43. The test switch signal analyzer of claim 41, wherein the analyzer hub includes a printed circuit board that includes two rows of contact apertures, each contact aperture configured to receive a probe such that each probe is aligned with a component of one of the plurality of test switch conductors after said probe is received in the contact aperture.

44. The test switch signal analyzer of claim 1, further comprising a user-interface coupled to the signal processing unit, the user-interface including at least one of: an optical display, a touch-screen display, a mouse, a touchpad, a joystick, a keypad, and push buttons.

45. The test switch signal analyzer of claim 44, wherein the test switch cover includes at least one access port such that when test switch cover is secured to the test switch base, the user-interface coupled to the signal processing unit is visible and touchable from a position external to the test switch cover.

46. The test switch signal analyzer of claim 44, wherein the test switch cover includes a translucent lens embedded in an outer surface of the test switch cover such that when the test switch cover is secured to the test switch base, the user-interface coupled to the signal processing unit is visible from the position external to the test switch cover.

47. The test switch signal analyzer of claim 1, wherein the test switch base is integral to a second device and wherein the test switch cover includes a perimeter engagement surface configured and dimensioned such that substantially all of the perimeter engagement surface contacts the second device when the test switch cover is secured to the test switch base.

48. The test switch signal analyzer of claim 47, wherein the second device is a substation relay.

49. The test switch signal analyzer of claim 47, wherein the second device is an electric meter.

50. The test switch signal analyzer of claim 1, wherein the test switch cover includes conductors aligned with the plurality of test switch conductors in the test switch base and wherein the conductors of the test switch cover complete conductor circuit paths in the test switch base when the test switch cover is secured to the test switch base and wherein the conductors of the test switch cover act to open the conductor circuit paths in the test switch base when the test switch cover is removed from the test switch base.

51. The test switch signal analyzer of claim 1, wherein the at least one signal probe is configured to measure electrical signals on the at least one test switch conductor when the at least one test switch conductor is in an open position.

52. The test switch signal analyzer of claim 1, wherein each of the plurality of sampled signal values has a time-based relation to another of the plurality of sampled signal values.

53. The test switch signal analyzer of claim 52, wherein the signal processing unit is configured to sample the at least one probe signal received from the at least one signal probe according to a time-based sampling interval.

54. The test switch signal analyzer of claim 52, wherein the time-based sampling interval is a uniform sampling interval.

55. The test switch signal analyzer of claim 52, wherein the time-based sampling interval is a random sampling interval.

56. The test switch signal analyzer of claim 8, wherein the current probe includes a CT probe.

57. The test switch signal analyzer of claim 56, wherein the CT probe is configured to wrap around wiring external to the test switch base and couple to one of the plurality of test switch conductors when the one of the plurality of test switch conductors is in a closed position.

58. The test switch signal analyzer of claim 9, wherein the Rogowski coil is configured to wrap around wiring external to the test switch base and couple to the one of the plurality of test switch conductors when the one of the plurality of test switch conductors is in a closed position.

59. The test switch signal analyzer of claim 1 wherein the at least one signal probe is extendable through an aperture in the test switch cover.

60. The test switch signal analyzer of claim 1, wherein the at least one signal probe is extendable through an aperture in the test switch base.

61. The test switch signal analyzer of claim 1, wherein the at least one signal probe is extendable through an opening between the test switch cover and the test switch base.

62. The test switch signal analyzer of claim 1, wherein the test switch cover is configured and dimensioned to mate with and mount to a front of the test switch base.

63. The test switch signal analyzer of claim 1, wherein the test switch cover is configured and dimensioned to mate with and mount to a rear of the test switch base.

64. The test switch signal analyzer of claim 1, wherein the electrical signals include a current signal.

65. The test switch signal analyzer of claim 1, wherein the voltage probe includes a conductor that is configured to pass current from at least one of the plurality of test switch conductors to the analyzer hub.

\* \* \* \* \*